(12) United States Patent
Oguro et al.

(10) Patent No.: US 6,486,734 B2
(45) Date of Patent: Nov. 26, 2002

(54) AMPLIFIER APPARATUS

(75) Inventors: Keiichi Oguro, Kawasaki (JP); Masafumi Shigaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/791,038

(22) Filed: Feb. 23, 2001

(65) Prior Publication Data

US 2001/0054932 A1 Dec. 27, 2001

(30) Foreign Application Priority Data

Jun. 14, 2000 (JP) ........................ 2000-178996

(51) Int. Cl.[7] ................................ H03F 1/26
(52) U.S. Cl. ........................ 330/149; 330/151
(58) Field of Search ................ 330/149, 151; 375/297

(56) References Cited

U.S. PATENT DOCUMENTS

| | | | |
|---|---|---|---|
| 4,276,514 A | * 6/1981 | Huang | 330/149 |
| 5,467,056 A | * 11/1995 | Goumaz | 330/149 |
| 5,770,971 A | * 6/1998 | McNicol | 330/149 |
| 5,838,195 A | * 11/1998 | Szmurdo et al. | 330/149 |
| 6,133,789 A | * 10/2000 | Braithwaite | 330/149 |

FOREIGN PATENT DOCUMENTS

JP  05-167356  7/1993

* cited by examiner

*Primary Examiner*—Robert Pascal
*Assistant Examiner*—Khanh Van Nguyen
(74) *Attorney, Agent, or Firm*—Katten, Muchin, Zavis, Rosenman

(57) ABSTRACT

An amplifier apparatus including a first dividing circuit disposed at the input side of an amplifier, for dividing an input signal into a primary signal to be amplified by the amplifier and an auxiliary signal for distortion detection, a distortion compensating signal generating circuit for generating a distortion compensating signal, based on the auxiliary signal and the output of the amplifier, to compensate a distortion component contained in the output of the primary amplifier and inputting the generated signal into the amplifier, and a primary signal combining circuit for combining the primary signal obtained by the first dividing circuit 1 with the distortion compensating signal. The result is that even using an auxiliary amplifier whose gain is small or without using such auxiliary amplifier in a feedback system, the distortion component contained in the output of the amplifier can be effectively compensated.

27 Claims, 19 Drawing Sheets

AMPLIFIER APPARATUS

BACKGROUND OF THE INVENTION

1. Field of the Invention

This invention relates to an amplifier apparatus suitable for use in communication terminals such as mobile phones, base stations, and RF circuits.

2. Description of the Related Art

In the mobile communications terminals such as mobile phones, base stations, and RF circuits, a signal to be transmitted is amplified by an electric power amplifier before transmitted. At that time, an intermodulation distortion component is caused in an output of the amplifier. Since this intermodulation distortion component appears as noises in the signal transmitted, a feedback-type amplifier or any ordinary type of amplifier has been used in the conventional art to remove this intermodulation distortion component.

FIG. 18 of the accompanying shows a distortion feedback-type amplifier disclosed in Japanese Patent Laid-Open Publication No. HEI 5-167356. The distortion feedback-type amplifier 100 of FIG. 18 comprises a first dividing circuit 101, a first phase/power level regulating circuit 102, a first amplifier (primary amplifier) 103, a second dividing circuit 104, a second phase/power level regulating circuit 105, a first combining circuit 106, a second amplifier (auxiliary amplifier) 107, a band-pass filter 108a, a third phase/power level regulating circuit 108b, and a second combining circuit 109.

The first dividing circuit 101 divides an input signal from an input terminal (IN) to pick up a part of the input primary signal as an auxiliary signal for distortion detection (described later). The first phase/power level regulating circuit 102 regulates the phase and the power level of the auxiliary signal obtained by the first dividing circuit 101.

The primary amplifier 103 amplifies the primary signal received from the first dividing circuit 101, and the second dividing circuit 104 picks up a part of an output of the primary amplifier 103.

The second phase/power level regulating circuit 105 regulates the phase and the power level of the signal picked up by the second dividing circuit 104. The first combining circuit 106 combines the signal (frequency spectrum 114) from the second phase/power level regulating circuit 105 and the auxiliary signal (frequency spectrum 115) that has been regulated in phase/power level by the first phase/power level regulating circuit 102 to cancel a primary signal component contained in the output (frequency spectrum 113) from the primary amplifier 103 for detecting an intermodulation distortion component (hereinafter also called "distortion component").

For this purpose, the first phase/power level regulating circuit 102 and the second phase/power level regulating circuit 105 regulates phase rotation and attenuation of the input signal in such a way that a primary signal component 130 in the amplified signal (frequency spectrum 114) is combined with the auxiliary signal (frequency spectrum 115) in opposite phases at the same power level by the first combining circuit 106.

The auxiliary amplifier 107 amplifies the distortion component (frequency spectrum 116) obtained by the first combining circuit 106. The third phase/power level regulating circuit 108b regulates the phase and power level of the output of the auxiliary amplifier 107. The band-pass filter 108a removes unnecessary band components in the signal from the third phase/power level regulating circuit 108b.

Since the phase is rotated through 360 degrees between the opposite ends of the pass band in the band-pass filter 108a, a phase error with respect to a feedback signal (distortion compensating signal) is apt to be increased. Particularly, the wider the band width, the phase error would increase.

The second combining circuit 109 combines the distortion compensating signal (frequency spectrum 117) from the band-pass filter 108a with the primary signal (frequency spectrum 112) from the first dividing circuit 101 (frequency spectrum 118).

The third phase/power level regulating circuit 108b regulates the phase rotation and the power level of the distortion component obtained from the auxiliary amplifier 107 in such a way that the distortion component (frequency spectrum 116) amplified by the auxiliary amplifier 107 is opposite in phase to the primary signal component 130 of the signal (frequency spectrum 118) to be input to the primary amplifier 103 and that the distortion component 131 is canceled in the output (frequency spectrum 119) of the primary amplifier 103.

Namely, the second dividing circuit 104, the second phase/power level regulating circuit 105, the first combining circuit 106, the auxiliary amplifier 107, the third phase/power level regulating circuit 108b, and the band-pass filter 108a constitute a feedback loop (feedback system) 135 for an input/output system of the primary amplifier 103.

With this construction, in the conventional distortion feedback-type amplifier 100, the primary signal (frequency spectrum 111) input from the input terminal (IN) is divided into the primary signal (frequency spectrum 112) and the auxiliary signal (frequency spectrum 110) by the first dividing circuit 101, which auxiliary signal is then input to the first phase/power level regulating circuit 102 to be regulated in phase rotation and attenuation.

In the meantime, the primary signal (frequency spectrum 112) is amplified by the primary amplifier 103, at which time a distortion component 131 with respect to the primary signal component 130 is generated in the output (frequency spectrum 113) of the primary amplifier 103 due to the nonlinear characteristic of the primary amplifier 103.

Then a part of the output signal (frequency spectrum 113) of the primary amplifier 103 is picked up by the second dividing circuit 104 and is regulated in phase and power level by the second phase/power level regulating circuit 105.

The auxiliary signal (frequency spectrum 115) having passed the first phase/power level regulating circuit 102 is combined with the primary signal (frequency spectrum 114) in opposite phase at the same power level by the first combining circuit 106 to cancel the primary signal component 130, thereby extracting only the distortion component 131 (frequency spectrum 116).

The thus extracted distortion component 131 is amplified by the auxiliary amplifier 107 and is then regulated in phase rotation and attenuation by the third phase/power level regulating circuit 108b. After that, unnecessary band components other than the desired band, which are caused such as by oscillation in the feedback loop 135, are stopped by the band-pass filter 108a so that only the desired band component is output to the second combining circuit 109 as the distortion compensating signal (frequency spectrum 117).

The second combining circuit 109 thereby combines the distortion compensating signal (frequency spectrum 117) with the primary signal (frequency spectrum 112) to output the combined signal (frequency spectrum 118) to the primary amplifier 103.

As the result, the effect of the non-linear characteristic of the primary amplifier 103 is canceled in the signal(frequency spectrum 118) input to the primary amplifier 103. The resultant signal (frequency spectrum 119) whose intermodulation distortion component 131 is restrained is thus output from the primary amplifier 103 via the second dividing circuit 104, whereupon this signal is output from the output terminal (OUT) as the output of the distortion feedback-type amplifier 100.

Assuming that a transfer function of the distortion feedback-type amplifier 100 of FIG. 18 is obtained using an equivalent circuit of FIG. 19, the output $e_o$ of the distortion feedback-type amplifier 100 is given by $$e_o = A \cdot e_{io} + D \qquad (1)$$

where $e_i$ is the primary signal to be input from the input terminal, D is the intermodulation distortion component to be added to the output of the primary amplifier 103, and A is the gain of the primary amplifier 103. In equation (1), $e_{io}$ is $$e_{io} = e_i + (C + e_i + K \cdot e_o) \cdot B \cdot L \qquad (2)$$

therefore $e_o$ is $$e_o = A(1 + B \cdot C \cdot L)/(1 - A \cdot B \cdot K \cdot L) \cdot e_i + D/(1 - A \cdot B \cdot K \cdot L) \qquad (3)$$

where K is the combining degree (attenuation rate) of the first combining circuit 106, B is the gain of the auxiliary amplifier 107, and L is the combining degree of the second combining circuit 109.

Here, as described above, because the auxiliary signal (frequency spectrum 115 of FIG. 18) is regulated so as to cancel the primary signal component contained in the primary signal (frequency spectrum 114) from the second phase/power level regulating circuit 105, $A \cdot K = -C$. Therefore $$e_o = A \cdot e_i + D/(1 + B \cdot C \cdot L) \qquad (4)$$

In this equation (4), the first term $A \cdot e_i$ represents an amplitude component of the primary signal; the second term $D/(1 + B \cdot C \cdot L)$, an intermodulation distortion component. It turns out from this equation (4) that the intermodulation distortion component of the distortion feedback-type amplifier 100 of FIG. 18 depends upon B, C, L and also that the second term denominator, $1 + B \cdot C \cdot L$, should take a sufficiently large value in order to adequately remove the distortion component.

However, L, which is the combining degree of the second combining circuit 109, and C depending upon K, which is the combining degree of the first combining circuit 106, can be set to only an insufficiently large value with a limited range of variation.

Therefore, in order to diminish the intermodulation distortion component 131, the gain B of the auxiliary amplifier 107 must take an adequately great value. This, however, would not only cause increased power consumption of the whole circuitry but the circuit size and the number of components of the auxiliary amplifier 107 are also increased due to plural transistors needed, for example, thus consequently increasing the costs. And, because of a large output needed, the auxiliary amplifier 107 should be realized by an amplifier that generates no distortion. Also, a bad influence of phase rotation is also increased, affecting the regulations of phase rotation and power level in the third phase/power level regulating circuit 108b. Such construction is inadaptable in a wide range of band, and suppression of distortion in high rate signals cannot be attained.

SUMMARY OF THE INVENTION

With the foregoing problems in view, it is an object of the present invention to provide an amplifier apparatus that can effectively compensate for the distortion component contained in the output of an amplifier even in the presence of an auxiliary amplifier whose gain is small or even in the absence of such an auxiliary amplifier in a feedback system.

In order to attain the above object, according to the present invention, there is provided an amplifier apparatus comprising: an amplifier; a first dividing circuit, connected to an input side of the amplifier, for dividing an input signal into a primary signal, which is amplified by the amplifier, and an auxiliary signal, which is used for distortion detection; a distortion compensating signal generating circuit for generating a distortion compensating signal, which compensates a distortion component contained in an output of the amplifier, and inputting the distortion compensating signal to the amplifier; and a primary signal combining circuit (first combining circuit) for combining the primary signal obtained by the first dividing circuit with the distortion compensating signal, which is generated by the distortion compensating signal generating circuit.

With this amplifier apparatus of the present invention, since the distortion compensating signal obtained by the distortion compensating signal generating circuit is input directly to the amplifier while the primary signal to be amplified is added to the distortion compensating signal to combine these signals, a loss in the gain of the distortion compensating signal can be minimized, compared to a conventional amplifier apparatus in which the distortion compensating signal is added to the primary signal. This can eliminate the need for an amplifier (auxiliary amplifier) which amplifies the distortion compensating signal in the distortion compensating signal generating circuit, or can suppress at least the amplifying rate to a minimal necessary value, thus effectively compensating the distortion component as compared to the conventional technology.

Moreover, since the auxiliary amplifier can be unnecessitated, it is possible to reduce the power consumption, the circuit size, and the number of components of the amplifier apparatus, thus reducing costs.

As a preferred feature, (1) the first dividing circuit may be connected to an input side of the primary signal combining circuit so that the auxiliary signal can be obtained at an input side of the primary signal combining circuit with ease. As another preferred feature, (2) the first dividing circuit may be disposed between the primary signal combining circuit and the amplifier so that an auxiliary signal with a view to the influence of disturbance at the input side of the present amplifier apparatus can be obtained.

In the former case (1), since the value of distortion compensating signal obtained is large relatively to the primary signal, the distortion component generated in the amplifier can be removed more effectively.

In the latter case (2), since the auxiliary signal can be obtained with a view to the influence of disturbance occurred at the input side of the amplifier apparatus, it is possible to compensate the distortion component more effectively.

Particularly in this case, the first dividing circuit is the closer to the amplifier and the primary signal combining circuit is the closer to the input side, the more strongly the amplifier apparatus can prevent oscillation.

The present circuit is a feed-back circuit, which could generate oscillation. Precisely, if an oscillation component appears in the path starting from the primary amplifier, which passes through a coupler and an auxiliary amplifier and returns to the primary amplifier, oscillation could be caused in case of no means equipped for canceling the oscillation component. In the above-mentioned circuit, however, the oscillation component is input to the distortion compensating signal generating circuit, via the first dividing circuit, to be cancelled thereby on the basis of output of the primary amplifier including the same oscillation component. With this construction, signals in a range of band in which a distortion compensating process is available are free of the oscillation component generated in the feed-back circuit.

As still another preferred feature, the distortion compensating signal generating circuit includes: a second dividing circuit for picking up a part of the output of the amplifier; and a combining circuit (second combining circuit) for combining the part of the output of the amplifier, which part is picked up by the second dividing circuit, and the auxiliary signal obtained by the first dividing circuit in opposite phases to detect the distortion component; and a first phase/power level regulating circuit for regulating an output of the combining circuit in phase and power level to output the distortion compensating signal. This would guarantee an effective compensation for the distortion component with simple construction.

As a further preferred feature, the distortion compensating signal generating circuit further includes a differential amplifier to which a part of the output of the amplifier, which part is picked up by the second dividing circuit, and an auxiliary signal obtained by the first dividing circuit are to be input, and the combining circuit (second combining circuit) is constructed so as to combine outputs of the differential amplifier. With this construction, it is unnecessary to provide the combining circuit (second combining circuit), the amplifier for compensating the distortion of the signal extracted by the second dividing circuit and of the auxiliary signal, and the amplifier for amplifying the distortion compensating signal, as separate circuits. Since these circuits can be integrated onto a single microchip, it is possible to detect and amplify the distortion component with a simple construction.

As a still further preferred feature, the distortion compensating signal generating circuit includes an auxiliary signal combining circuit (third combining circuit) for combining a part of the auxiliary signal with the output of the combining circuit (second combining circuit). With this construction, since a primary signal component remaining in the output of the combining circuit (second combining circuit) can be removed, it is possible to improve the accuracy of detection of the distortion component so that a high-accuracy distortion compensating signal can be obtained, guaranteeing more effective compensation for the distortion component.

As an additional preferred feature, the distortion compensating signal generating circuit includes an amplifier-output combining circuit (fourth combining circuit) for combining part of the output of the amplifier, which part is picked up by the second dividing circuit, with the output of the combining circuit (second combining circuit). With this construction, since the primary signal component remaining in the output of the combining circuit (second combining circuit) can be removed, it is possible to improve the accuracy of detection of the distortion component so that a high-accuracy distortion compensating signal can be obtained, guaranteeing more effective compensation for the distortion component.

Further, a second phase/power level regulating circuit may be disposed between the second dividing circuit and the combining circuit (second combining circuit), and/or between the first dividing circuit and the combining circuit. The second phase/power level regulating circuit regulates the auxiliary signal and the part of the output of the amplifier, which is obtained by the second dividing circuit, in phase and power level, so that they have the same power level in opposite phase. With this construction, the auxiliary signal and the part of the output of the amplifier can be combined with ease by the combining circuit (second combining circuit) in the same power level as well as in opposite phase.

As another preferred feature, a primary signal attenuation compensating amplifier may be connected to an input side of the first dividing circuit. With this construction, since the primary signal attenuation compensating amplifier compensates for attenuation of the primary signal, which attenuation occurs when the primary signal combining circuit combines the primary signal with the distortion compensating signal, it is possible to obtain a sufficient gain of the primary signal so that a sufficiently large gain of the output of the amplifier apparatus and effective compensation for the distortion can be achieved.

As still another preferred feature, the distortion compensating signal generating circuit may include an auxiliary amplifier for amplifying the distortion compensating signal. With this construction, since the gain required for the distortion compensating signal can be secured by an amplifier having a minimal gain, it is possible to use even an amplifier with small power consumption in obtaining a high-accuracy distortion compensating signal, thus guaranteeing effective distortion compensation.

As a further preferred feature, the distortion compensating signal generating circuit includes a plurality of series-connected band-stop filters whose band-stop center frequencies are individually shifted off the band of the primary signal toward a low band side or a high band side to constitute a first composite filter which allows signal transmission in the band of the primary signal, or a low-pass filter and a high-pass filter which are connected in series to constitute a second composite filter which allows signal transmission in the band of the primary signal. With this construction, unnecessary components for the distortion compensating signal can be removed as unnecessary phase rotation in a pass band of the primary signal is prevented. Accordingly, it is possible to obtain an accurate distortion compensating signal so that more effective distortion compensation can be achieved.

Other objects and further features of the present invention will be apparent from the following detailed description when read in conjunction with the accompanying drawings.

DESCRIPTION OF THE PREFERRED EMBODIMENT(S)

Various embodiments of the present invention will now be described with reference to the accompanying drawings.

Figure 1:
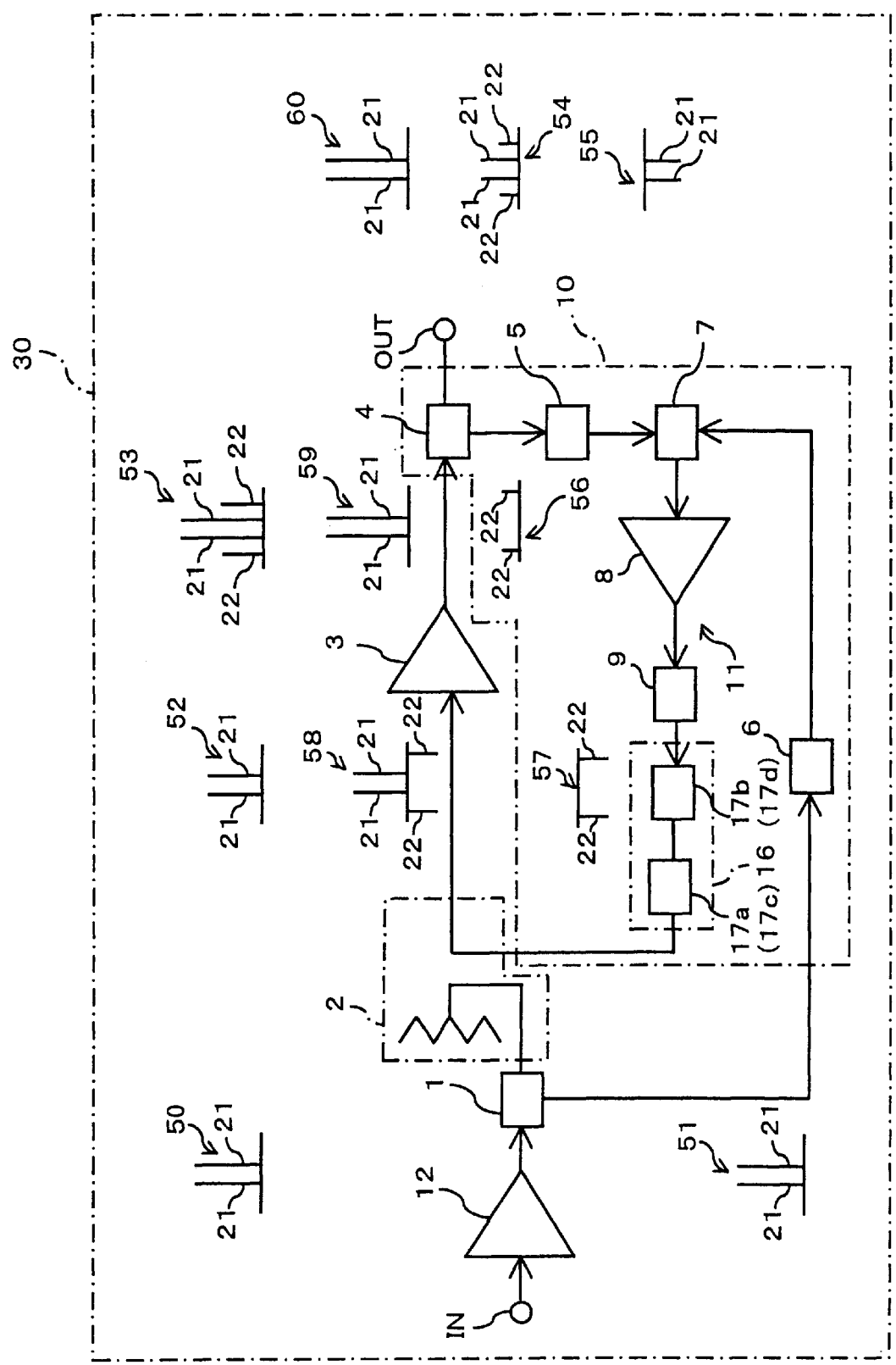
FIG. 1 is a circuit diagram of a feedback-type amplifier apparatus according to a first embodiment of the present invention.

(A) First Embodiment:

FIG. 1 shows a circuit diagram of a feedback-type amplifier apparatus (hereinafter called "amplifier apparatus") according to a first embodiment of the present invention. The amplifier apparatus 30 of FIG. 1 comprises a first dividing circuit 1, a primary signal combining circuit (first combining circuit) 2, an amplifier (primary amplifier) 3, a distortion compensating signal generating circuit 10, and another amplifier (primary signal attenuation compensating amplifier) 12.

Reference numbers 50 through 60 each designate a frequency spectrum of a signal (hereinafter sometimes called signal (50) through signal (60), respectively).

The first dividing circuit 1 divides a signal (frequency spectrum 50) input from the primary signal attenuation compensating amplifier 12 into a primary signal (52) to be amplified by the primary amplifier 3, and an auxiliary signal (51) for detecting an intermodulation distortion component 22 contained in an output of the primary amplifier 3 with respect to a primary signal component 21.

Based on the output (53) of the primary amplifier 3 and the auxiliary signal (51) obtained by the first dividing circuit 1, the distortion compensating signal generating circuit 10 generates a distortion compensating signal (57) for compensating the intermodulation distortion component (hereinafter also called "distortion component") 22 contained in the output (53) of the primary amplifier 3, which distortion component 22 is caused due to the non-linearity of the primary amplifier 3, and inputs the generated distortion compensating signal (57) to the primary amplifier 3. The primary signal combining circuit 2 combines the primary signal (52) input from the first dividing circuit 1 with the distortion compensating signal (57) obtained by the distortion compensating signal generating circuit 10 to input the combined signal (frequency spectrum 58) to the primary amplifier 3.

For this purpose, the distortion compensating signal generating circuit 10 includes, for example, a second dividing circuit 4, a primary-amplifier-output phase/poser level regulating circuit 5, an auxiliary-signal phase/power level regulating circuit 6, a combining circuit (second combing circuit) 7, an auxiliary amplifier 8, a first phase/power level regulating circuit (distortion-compensating-signal phase/power level regulating circuit 9), and a filter 16.

Here, the second dividing circuit 4 picks up a part (54) of the output of the primary amplifier 3. The combining circuit 7 combines in opposite phases the part (54) of the output of the primary amplifier 3, which part is picked up by the second dividing circuit 4 and is regulated in phase/power level by the primary-amplifier-output phase/power level regulating circuit 5, with the auxiliary signal (55) obtained by the first dividing circuit 1 to detect the distortion component 22. In use, a directional coupler can serve as the second dividing circuit 4.

The primary-amplifier-output phase/power level regulating circuit 5 (second phase/power level regulating circuit) is disposed between the second dividing circuit 4 and the combining circuit 7, and the auxiliary-signal phase/power level regulating circuit 6 (second phase/power level regulating circuit) is disposed between the first dividing circuit 1 and the combining circuit 7 so that the phase and the power level are regulated in such a way that the auxiliary signal (55) and the part (24) of the output of the primary amplifier 3 obtained by the second dividing circuit 4 are equal in power level in opposite phases.

Namely, the primary-amplifier-output phase/power level regulating circuit 5 and the auxiliary-signal phase/power level regulating circuit 6 perform phase/power level regulations so that the primary signal component 21 from the second dividing circuit 4 and the auxiliary signal (53) are equal in power level in opposite phases. As the result, the primary signal component 21 contained in an output (56) of the combining circuit 7 is canceled.

Here, because canceling the primary signal component 21 by the combining circuit 7 suffices, it would be necessary to provide one of the primary-amplifier-output phase/power level regulating circuit 5 and the auxiliary-signal phase/power level regulating circuit 6.

If there are provided both the primary-amplifier-output phase/power level regulating circuit 5 and the auxiliary-signal phase/power level regulating circuit 6, one may exclusively take in charge of phase regulation while the other may exclusively take in charge of power level regulation.

The auxiliary amplifier 8 amplifies the distortion component 22 obtained by the combining circuit 7, namely, it amplifies the distortion component obtained by the combining circuit 7 to obtain a distortion compensating signal (57) having a sufficient gain for effective distortion compensation. As described later, according to the first embodiment, since the primary signal (52) from the primary signal combining circuit 2 is combined with the distortion compensating signal (57) input directly to the primary amplifier 3, no combining loss occurs in the distortion compensating signal (57) itself so that a sufficient gain by an auxiliary amplifier 8 having a significantly smaller gain than the conventional technology can be obtained.

Accordingly, since the reduced gain of the auxiliary amplifier 8 also decreases the amount of phase rotation in the auxiliary amplifier 8, it is possible to suppress the phase rotation in a feedback loop (feedback system) 11 as compared to the conventional technology so that the amplifier apparatus becomes applicable in a broad band.

The first phase/power level regulating circuit 9 regulates the output of the combining circuit 7 (the output of the combining circuit 7 as amplified by the auxiliary amplifier 8: distortion component) in phase/power level, so as to be equal in power level to the distortion component 22 contained in the output (53) of the primary amplifier 3 but in opposite phase, and outputs the resultant output of the combining circuit 7 as the distortion compensating signal (57).

A filter 16 removes an unnecessary band of frequency components contained in a signal input from the first phase/power level regulating circuit 9 to output the distortion compensating signal (57).

In use, the filter 16 maybe in the form of a single band-pass filter that obstructs frequencies off the central frequency of the primary signal. However, since the phase is rotated through 360 degrees between the opposite ends of the pass band, broadening of the pass band and fine adjustments at the center of the pass band would be necessary.

Therefore, to avoid this problem, the filter 16 may be provided in the form of band-stop filters 17a, 17b interconnected in series or a low-pass filter 17c and a high-pass filter 17d interconnected in series.

Figure 16A:
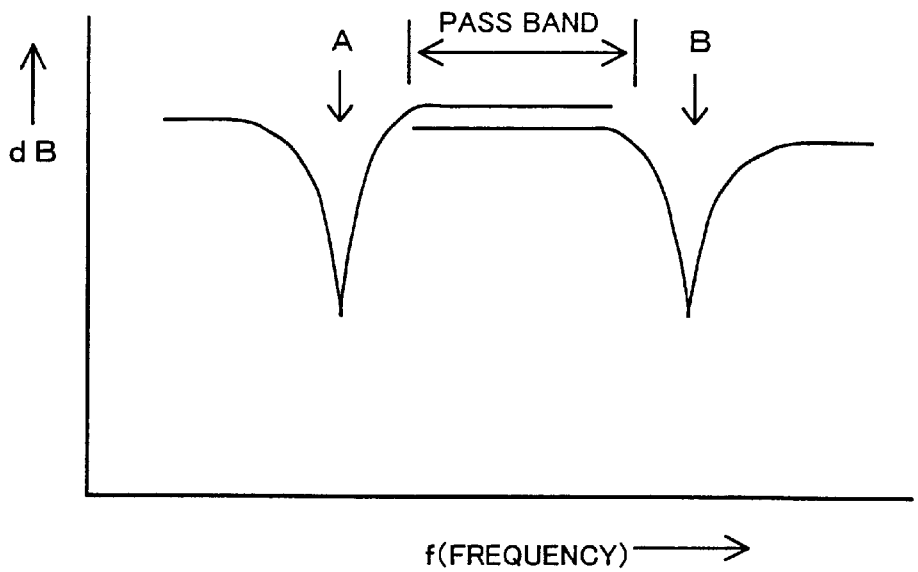
FIGS. 16(a) and 16(b) are graphs respectively illustrating an example of frequency characteristics of a filter of FIG. 1.
Figure 16B:
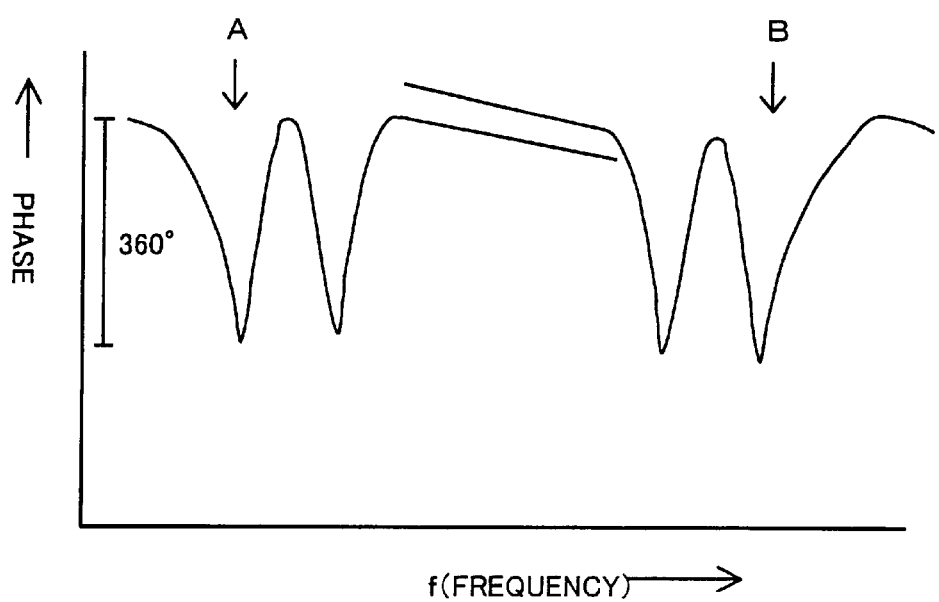

FIGS. 16(a) and 16(b) show exemplary frequency characteristics of the filter 16 made up with the band-pass filters 17a, 17b interconnected in series. In FIGS. 16(a) and 16(b), arrow A indicates the band-stop center frequency of the band-stop filter 17a for a low band side, and arrow B indicates the band-stop center frequency of the band-stop filter 17b for a high band side.

In other words, the band-stop filter 17a, which stops a frequency component shifted off a pass band of the primary signal (distortion compensating signal) toward the low band side (indicated by arrow A), is connected in series with the band-stop filter 17b, which stops a frequency component shifted off the pass band of the primary signal to the high band side (indicated by arrow B), to constitute a filter 16 having the above-mentioned pass band.

With this construction, moderate phase transition in the pass band can be achieved.

Figure 17A:
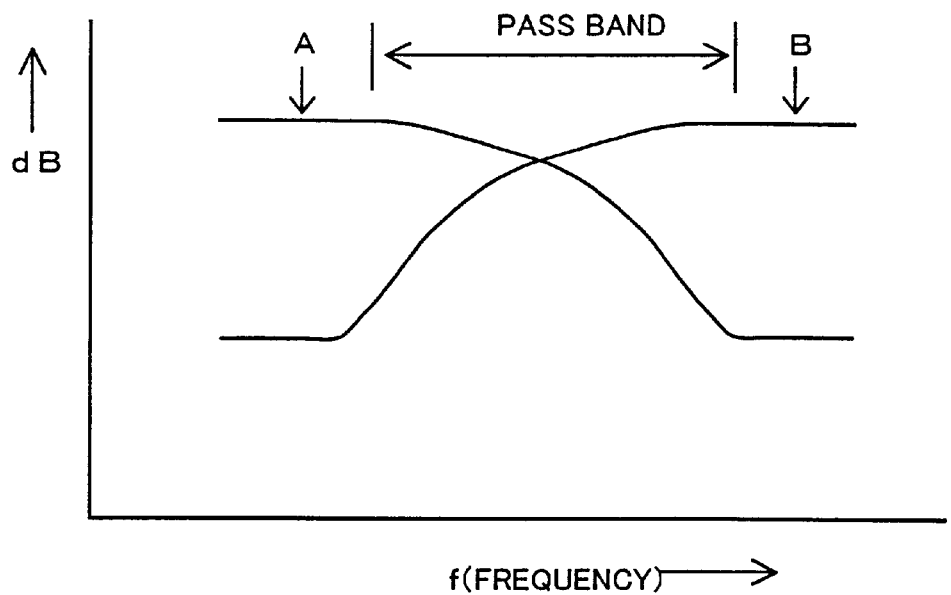
FIGS. 17(a) and 17(b) are graphs respectively illustrating another example of frequency characteristics of the filter of FIG. 1.
Figure 17B:
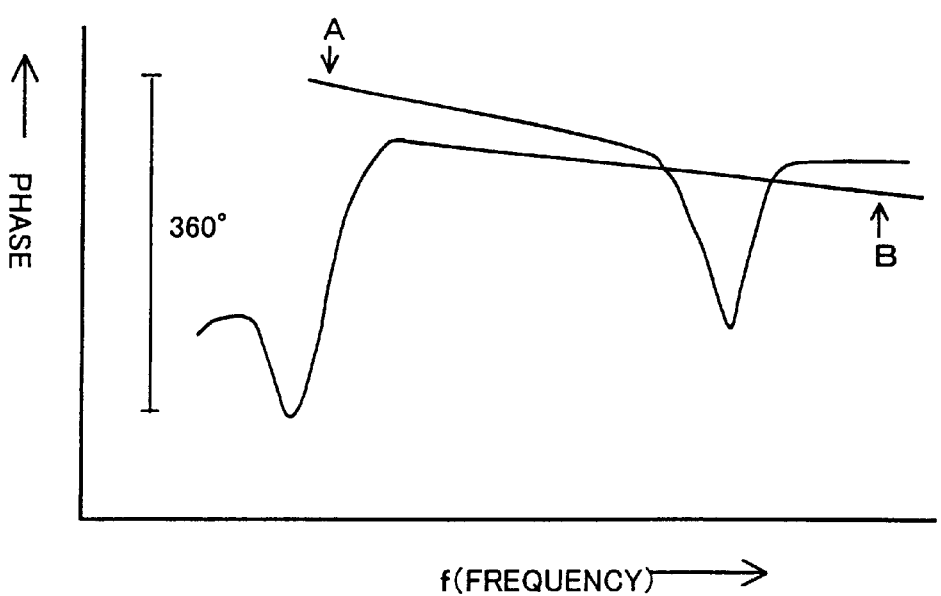

On the other hand, FIGS. 17(a) and 17(b) show exemplary frequency characteristics of the filter 16 made up with the low-pass filter 17c and the high-pass filter 17d interconnected in series. In FIGS. 17(a) and 17(b), arrow A indicates exemplary frequency characteristics of the low-pass filter 17c, and arrow B indicates exemplary frequency characteristics of the high-pass filter 17d.

In the filter 16, the low-pass filter 17c allows a low band side frequency component, which includes the band of the primary signal, to pass, and the high-pass filter 17d allows a high band side frequency component, which includes the band of the primary signal, to pass. In other words, the low-pass filter 17c stops the frequency component shifted off the primary signal toward the high band side, and the high-pass filter 17d stops the frequency component shifted off the primary signal toward the lower band side, making the band of the primary signal as a pass-band.

In FIG. 1, the second dividing circuit 4, the primary-amplifier-output phase/power level regulating circuit 5, the combining circuit 7, the auxiliary amplifier 8, the first phase/power level regulating circuit 9, and the filter 16 constitute a feedback loop (feedback system) 11 for an input/output system of the primary amplifier 3.

The primary signal attenuation compensating amplifier 12 can compensate for a gain equivalent to a combining degree (attenuation rate) of the primary signal combining circuit 2 when the primary signal (50) is combined with the distortion compensating signal (57) from the first phase/power level regulating circuit 9 by the primary signal combining circuit 2.

The operation of the amplifier apparatus 30 of the first embodiment will now be described.

Firstly a primary signal input from an input terminal (IN) via the primary signal attenuation compensating amplifier 12 is divided into a primary signal (50), which is input to the primary amplifier 3, and an auxiliary signal (51), which is input to the auxiliary-signal phase/power level regulating circuit 6, by the first dividing circuit 1.

The primary signal (50) is input to the primary amplifier 3 via the primary signal combining circuit 2 (see frequency spectrum 52) and is then amplified by the primary amplifier 3 (see frequency spectrum 53); the resultant signal is output from an output terminal (OUT).

Figure 3:
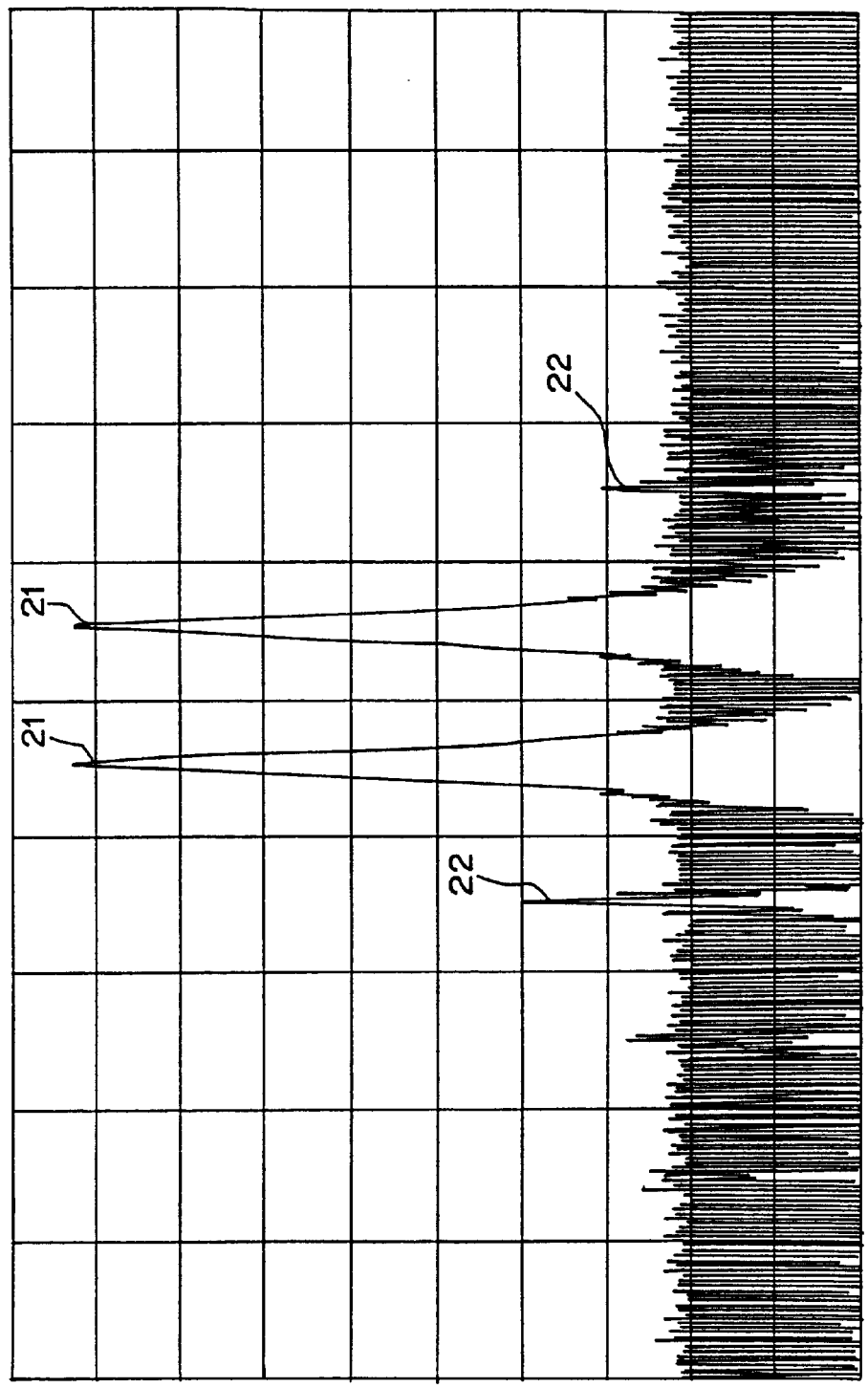
FIG. 3 is a graph illustrating an exemplary frequency spectrum of an output of a primary amplifier of the amplifier apparatus of the first embodiment.

At that time, as shown in FIG. 3, the output (53) of the primary amplifier 3 contains an intermodulation distortion component 22 with respect to a primary signal component 21, which distortion has occurred due to the non-linear characteristic of the primary amplifier 3.

Subsequently, a part of the output (53) of the primary amplifier 3 is extracted by the second dividing circuit 4 and is then input to the primary-amplifier-output phase/power level regulating circuit 5 to be regulated in phase/power level (see frequency spectrum 54).

In the meantime, the auxiliary signal (51) extracted by the first dividing circuit 1 is regulated in phase and power level by the auxiliary-signal phase/power level regulating circuit 6 so that the power level of the auxiliary signal (51) equals to that of the signal (54) from the primary-amplifier-output phase/power level regulating circuit 5 in opposite phases (see frequency spectrum 55).

As a signal (54) output from the primary-amplifier-output phase/power level regulating circuit 5 and an auxiliary signal (55) output from the auxiliary-signal phase/power level regulating circuit 6 are combined by the combining circuit 7, a primary signal component 21 contained in the signal (54) from the primary-amplifier-output phase/power level regulating circuit 5 is canceled by the auxiliary signal (55) from the auxiliary-signal phase/power level regulating circuit 6, extracting only a distortion component 22 (see frequency spectrum 56).

The thus extracted distortion component 22 is amplified by the auxiliary amplifier 8 before inputting to the first phase/power level regulating circuit 9 so that the phase of the input distortion component 22 is regulated so as to be opposite to the primary signal (52) and also that the power level of the input distortion component 22 is regulated so as to cancel the distortion component 22 contained in the output (53) of the primary amplifier 3. Further, unnecessary band components are removed by the filter 16, whereupon the resultant distortion compensating signal (57) is output.

The primary signal combining circuit 2 combines the primary signal (see frequency spectrum 52) with the distortion compensating signal (57) to obtain a composite signal formed of the distortion compensating signal (57) and the primary signal (58), which composite signal is then input to the primary amplifier 3 to be amplified (see frequency spectrum 59).

As the result, a distortion component 22 contained in the output of the primary amplifier 3 is canceled (see frequency spectrum 59), whereupon only the primary signal component 21 is output as an amplifier output (60) from the output terminal (OUT) via the second dividing circuit 4.

Figure 2:
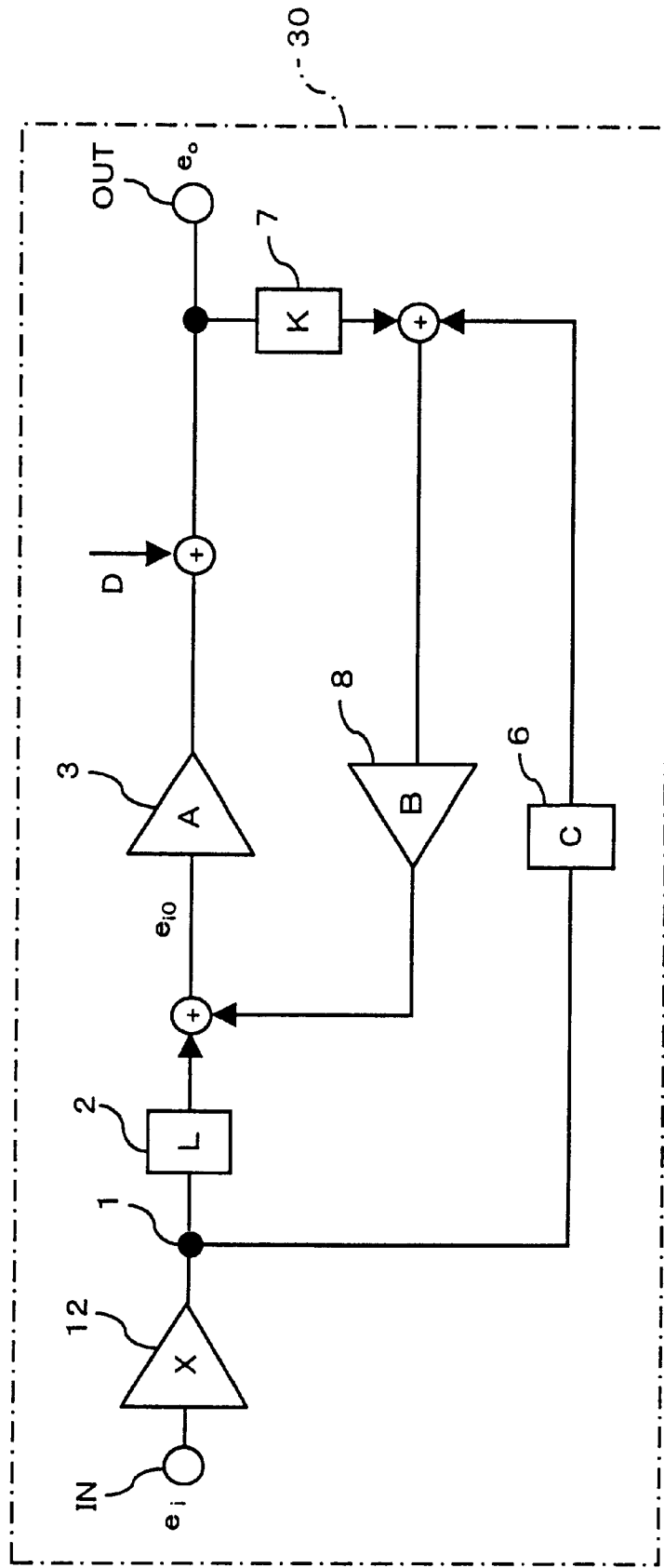
FIG. 2 is a diagram of an equivalent circuit for obtaining a transfer function of the amplifier apparatus of FIG. 1.

Assuming that a transfer function of the amplifier apparatus 30 of FIG. 1 is obtained using an equivalent circuit of FIG. 2, the output $e_o$ of the amplifier apparatus 30 of FIG. 1 is given by $$e_o = A \cdot e_{io} + D \quad (5)$$

where $e_i$ is the primary signal input from the input terminal, D is the intermodulation distortion component added to the output of the primary amplifier 3, A is the gain of the primary amplifier 3.

In equation (5), $e_{io}$ is $$e_{io} = X \cdot L \cdot e_i + (X \cdot C \cdot e_i + K \cdot e_o) \cdot B \quad (6)$$

therefore $e_o$ is $$e_o = A \cdot X \cdot (L + B \cdot C)/(1 - A \cdot B \cdot K) e_i + D/(1 - A \cdot B \cdot K) \quad (7)$$

where L is the combining degree (attenuation rate) of the primary signal combining circuit 2, B is the gain of the auxiliary amplifier 8, and X is the gain of the primary signal attenuation compensating amplifier 12.

Here, because the auxiliary signal (55) is regulated so as to cancel the primary signal component contained in the signal (54) from the primary-amplifier-output phase/power level regulating circuit 5, $$L \cdot A \cdot K = -C \quad (8)$$

Since the primary signal attenuation compensating amplifier 12 has the gain enough to compensate for the attenuation rate of the primary signal combining circuit 2, $X \cdot L = 1$. Therefore, the above equation (8) can also be expressed as $$AK = -X/C \quad (8')$$

therefore $$e_o = A \cdot e_i + D/(1 + B \cdot C \cdot X) \quad (9)$$

Figure 18:
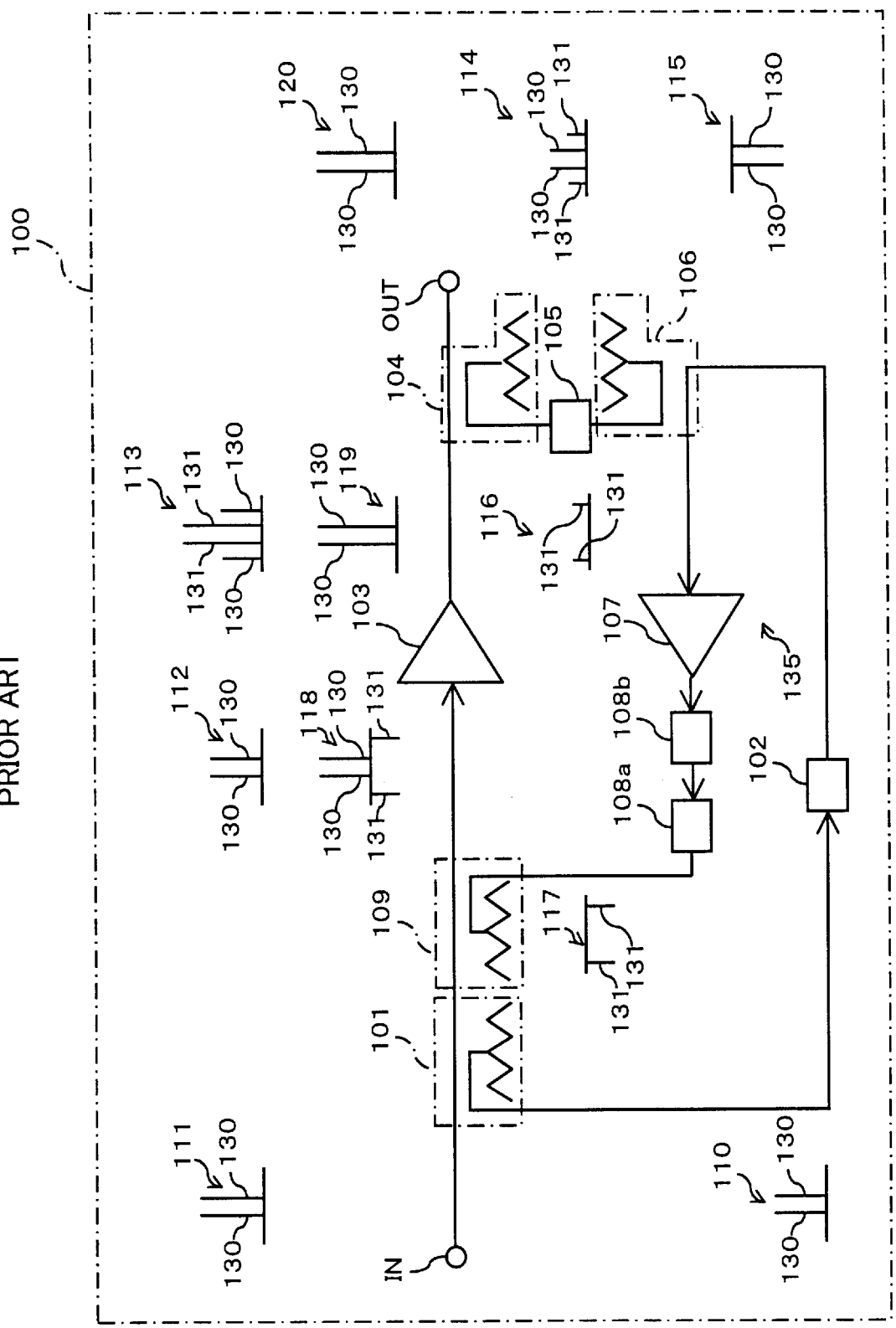
FIG. 18 is a circuit diagram of a conventional feedback-type amplifier apparatus.
Figure 19:
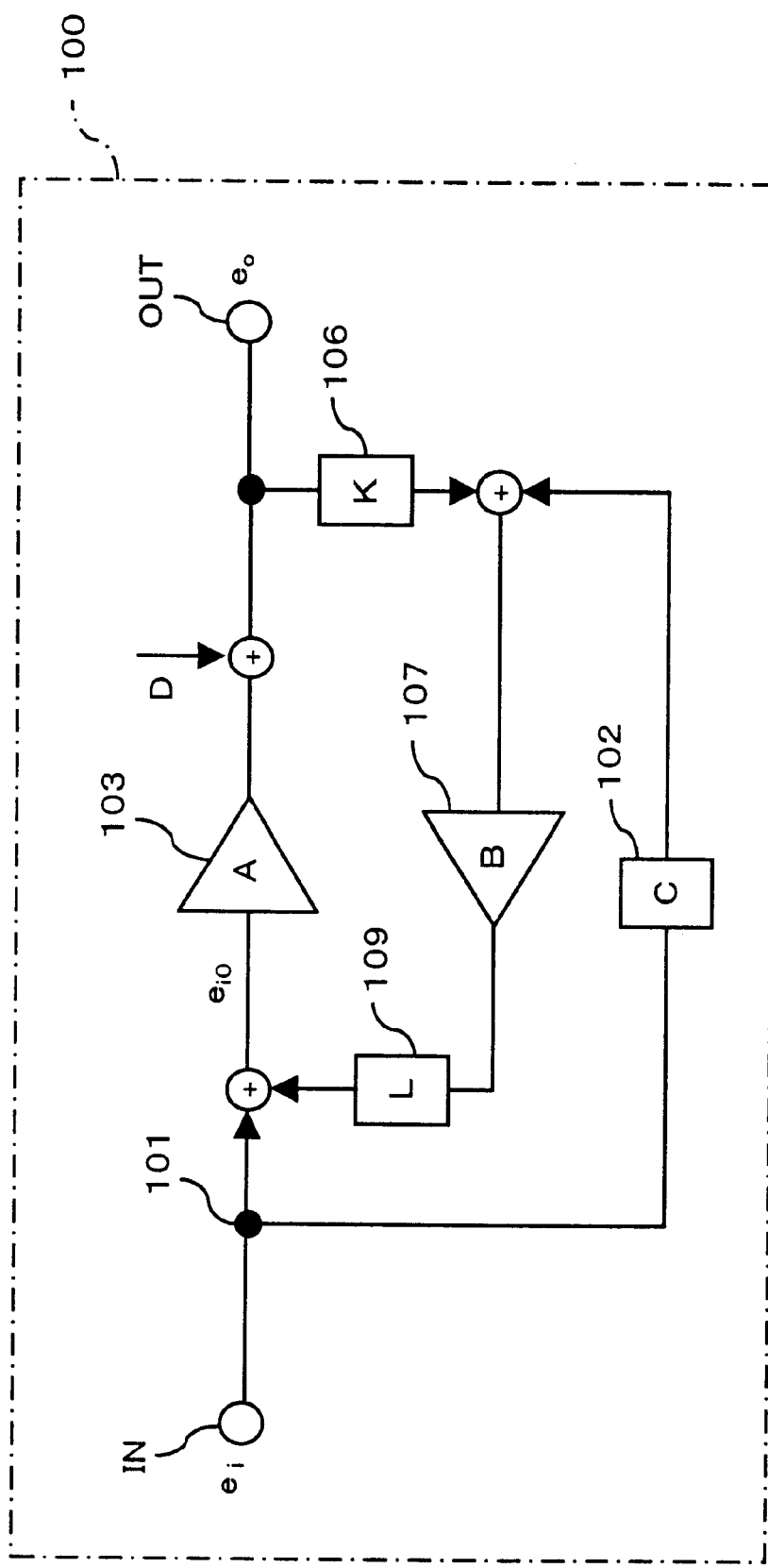
FIG. 19 is a circuit diagram of an equivalent circuit for obtaining a transfer function of the conventional amplifier apparatus of FIG. 18.

In this equation (9), the first term $A \cdot e_i$ indicates an amplitude component of the primary signal, and the second term $D/(1+B \cdot C \cdot X)$ indicates an intermodulation distortion component. Now in comparison of this second term $D/(1+B \cdot C \cdot X)$ of the equation (9) with the second term $D/(1+B \cdot C \cdot L)$ of the equation (4), which expresses the output of a conventional distortion feedback-type amplifier apparatus 100 of FIG. 18, $L<1$, $X \geq 1$. It turns out from the result of comparison that the distortion component is reduced in the amplifier apparatus 30 of the present invention even using an auxiliary amplifier 8 having the same gain as compared to the conventional distortion feedback-type amplifier 100 of FIG. 18.

In other words, in order to suppress the distortion component in an equal degree to the conventional technology, the amplifier apparatus 30 only requires an auxiliary amplifier 8 whose gain is smaller than in the conventional amplifier apparatus, thus suppressing the extent of phase rotation of the feedback system 135.

This is because the primary signal (52) to be amplified is added to the distortion compensating signal (57) to combine these signals, minimizing a loss in the gain of the distortion compensating signal (57) as compared to the conventional technology, in which the distortion compensating signal is added to the primary signal.

In the above-mentioned example, the amplifier having a gain $X=1/L$ functions as the primary signal attenuation compensating amplifier 12. This amplifier having such a particular gain is used because it would be convenient to compare the amplifier with the amplifier 100 of the conventional technology of FIG. 18. Alternatively a non-illustrated amplifier originally connected to the input side of the amplifier apparatus 30 may function as such an amplifier. Also, the primary signal attenuation compensating amplifier 12 has a relatively wide range of gain, and the phase rotation of the input primary signal is enhanced by increasing the amplification rate of the primary signal attenuation compensating amplifier 12 so that the distortion compensating signal would not be affected.

As mentioned above, in the amplifier apparatus 30 of the first embodiment, since the primary signal (52) is added to the distortion compensating signal (57) to combine these signals, the distortion compensating signal (57) is input to the primary amplifier 3 without being attenuated by the primary signal combining circuit 2.

Accordingly, it is possible to retard loss in the gain of the distortion compensating signal (57) to a minimum as compared to the conventional technology, in which the distortion compensating signal (57) is added to the primary signal (52). This would guarantee the advantageous results: it is possible to attain an effective distortion compensation even using the auxiliary amplifier 8 having a small gain; and it is possible to reduce the power consumption, the circuit size, and the number of components of the amplifier 8 so that power consumption and costs in the amplifier apparatus 30 also can be reduced.

Figure 5:
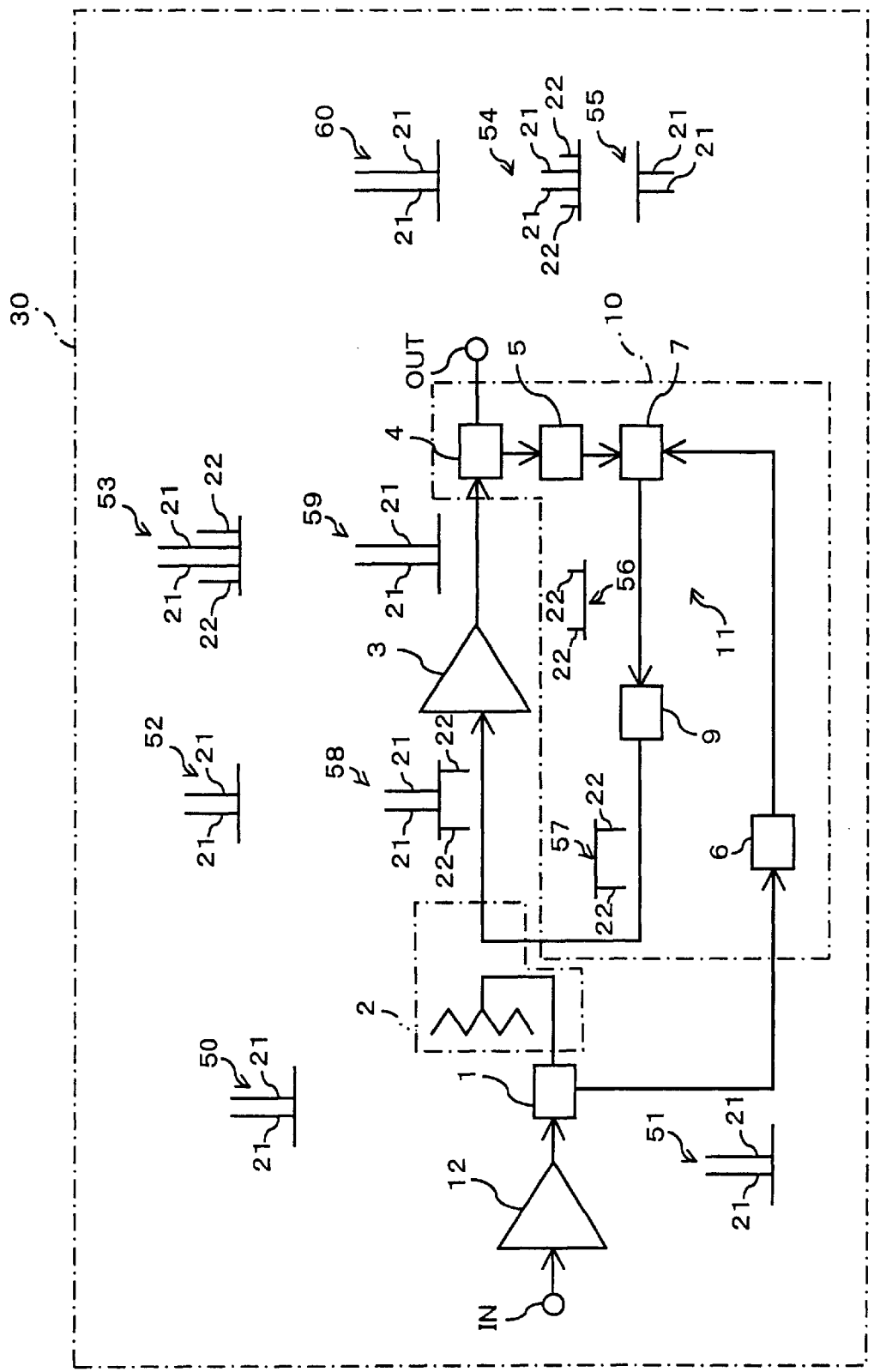
FIG. 5 is a circuit diagram showing an amplifier apparatus of the first embodiment.

In this instance, as long as a sufficient gain of the distortion compensating signal (57) is obtained, the auxiliary amplifier 8 may be omitted as shown in FIG. 5.

Namely, a distortion component 56 obtained by the combining circuit 7 can be input directly to the first phase/power level regulating circuit 9 without being amplified.

In this manner, since no auxiliary amplifier 8 is needed, it is possible to further reduce the power consumption, the circuit size, the number of components, and the costs. Additionally, since no active element is contained in a feedback loop 11 from the output of the primary amplifier 3 to the input of the primary amplifier 3, it is possible to prevent possible effect on the compensation for the distortion component due to the oscillation within the feedback loop 11 so that more effective distortion compensation can be achieved.

Figure 6:
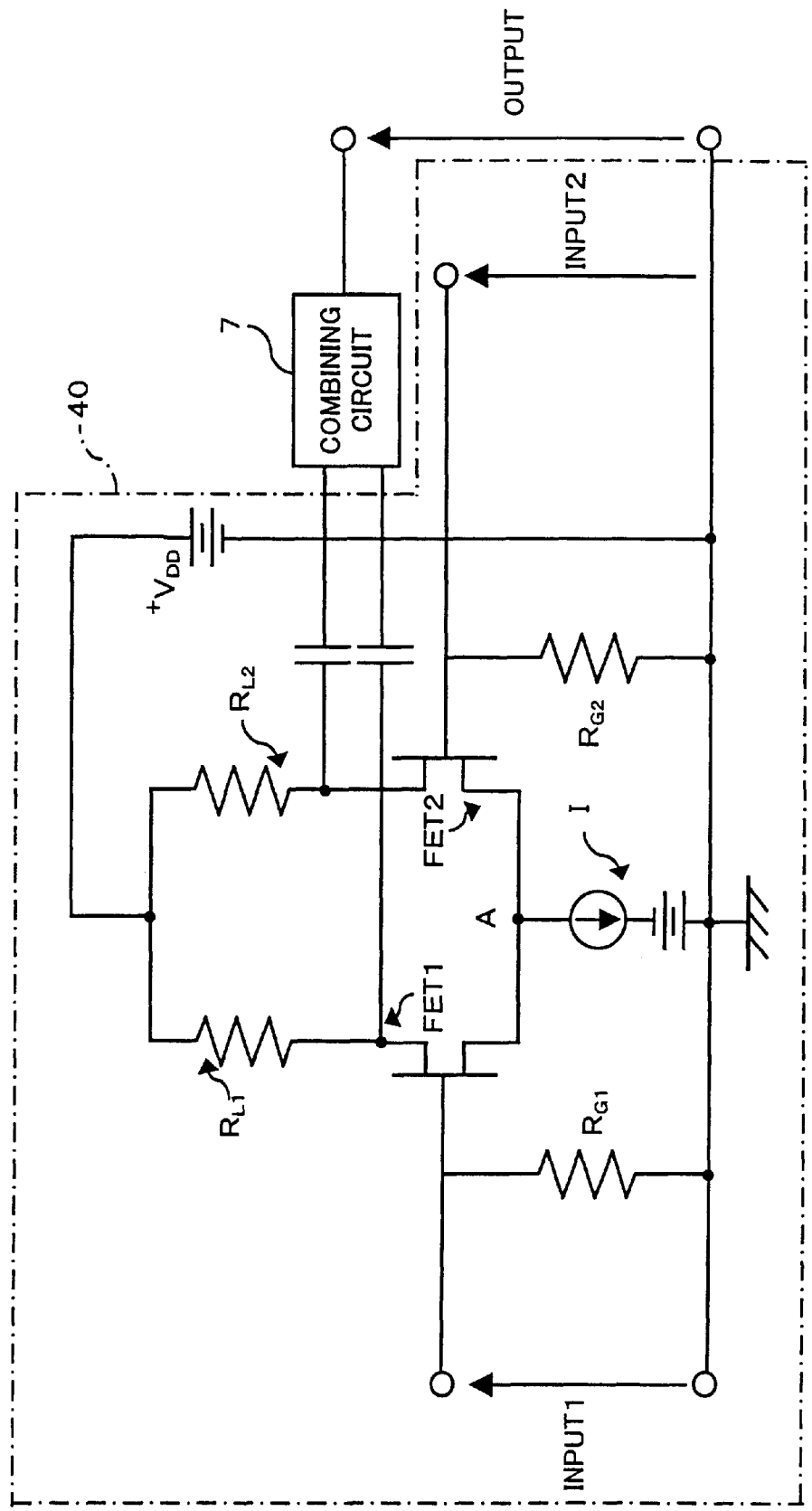
FIG. 6 is a circuit diagram showing an amplifier apparatus according to a first modification of the first embodiment.

(a1) First Modification of First Embodiment:

A differential amplifier 40 as of FIG. 6 may be provided at the input side of the combining circuit 7 of FIG. 1.

The differential amplifier 40 has a couple of transistors FET1, FET2 having identical characteristics and arranged symmetrically, output resistors RL1, RL2 disposed at a drain (collector) side of the transistors, and a constant current supply I disposed at a source (emitter) side of the transistors. A signal from the second dividing circuit 4 (FIG. 1) is input to Input 1; an auxiliary signal, to Input 2. The respective drain outputs of FET 1 and FET 2 are input to the combining circuit 7.

As the result, the output of the combining circuit 7 is obtained by combining the differential amplification outputs of the signal from the second dividing circuit 4 and the auxiliary signal. Therefore, only the distortion component is output as the primary signal component is canceled in the output.

In this manner, partly since the signal from the second dividing circuit 4 and the auxiliary signal are input to the differential amplifier 40, and partly since the outputs of the differential amplifier 40 are then combined by the combining circuit 7, it is unnecessary to provide the combining circuit 7, the amplifier for compensating the distortion in the part of the output of the primary amplifier 3, and the amplifier for compensating the distortion in the auxiliary signal, as separate circuits. Namely it is possible to integrate these circuits on a single microchip so that intended distortion compensation can be realized with a simple construction.

Figure 7:
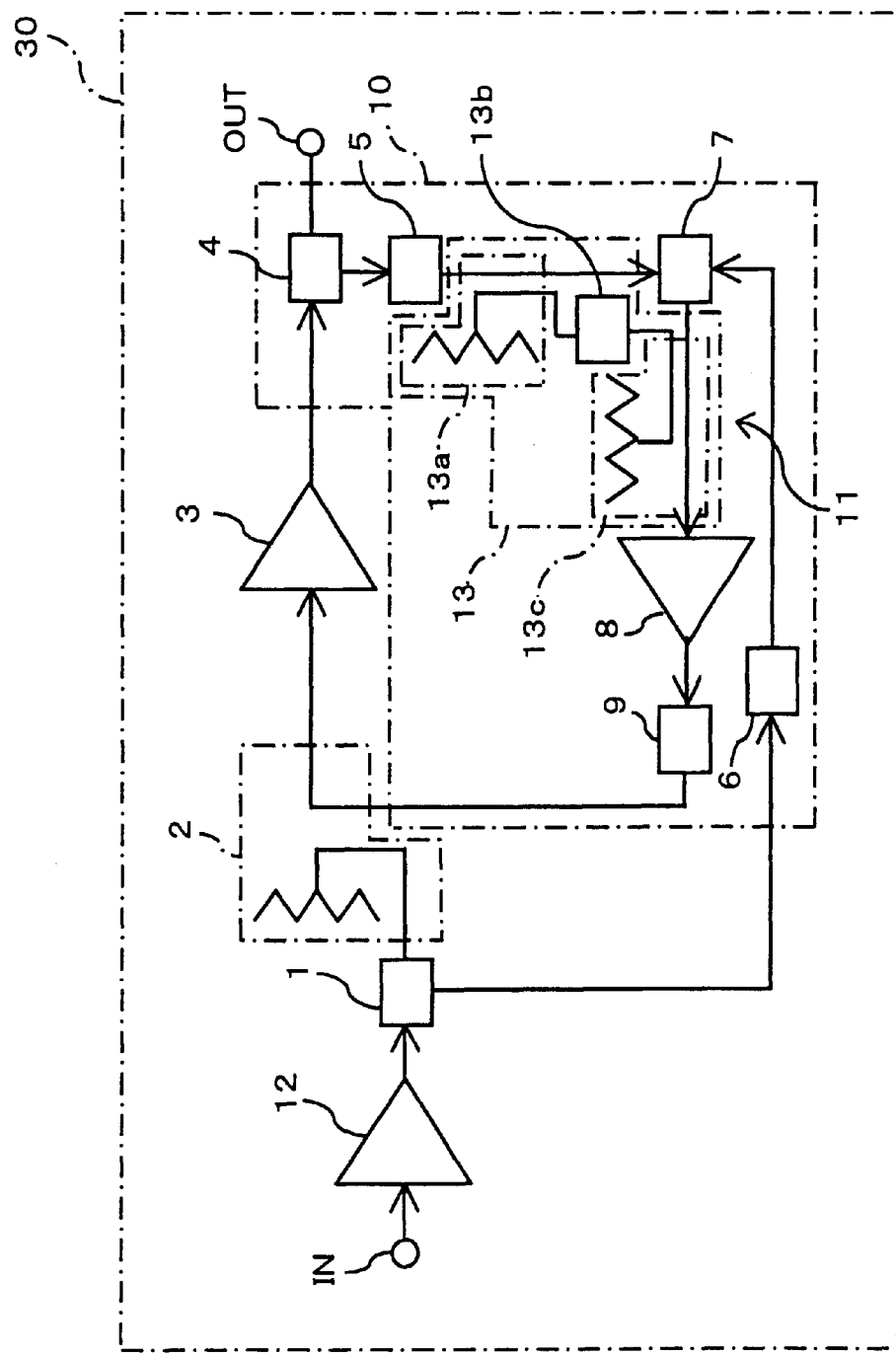
FIG. 7 is a circuit diagram showing an amplifier apparatus according to a second modification of the first embodiment.

(a2) Second Modification of First Embodiment:

FIG. 7 is a circuit diagram of an amplifier apparatus according to a second modification of the first embodiment. The amplifier apparatus 30 of FIG. 7 is different from that of FIG. 1 in that the amplifier-output combining circuit 13 is disposed in the feedback loop 11.

The amplifier-output combining circuit 13 combines a part of the output of the primary amplifier 3, which part is picked up by the second dividing circuit 4, with an output of the combining circuit 7. The amplifier-output combining circuit 13 comprises an amplifier-output dividing circuit 13a, a amplifier-output phase/power level regulating circuit 13b, and an amplifier-output combining circuit 13c.

The amplifier-output dividing circuit 13a picks up a part of a signal from the primary-amplifier-output phase/power level regulating circuit 5, the amplifier-output phase/power level regulating circuit 13b regulates the signal picked up by the amplifier-output dividing circuit 13a in phase and power level, and the amplifier-output combining circuit 13c combines the signal from the amplifier-output phase/power level regulating circuit 13b with the output from the combining circuit 7.

With this construction, in the amplifier apparatus 30 of the second modification of the first embodiment, the dividing circuit 13a picks up a part of the signal from the primary-amplifier-output phase/power level regulating circuit 5, and the amplifier-output phase/power level regulating circuit 13b regulates the picked up signal so as to be equal in power level in opposite phase to the primary signal component 21 remained uncanceled in an output of the combining circuit 7.

Figure 4:
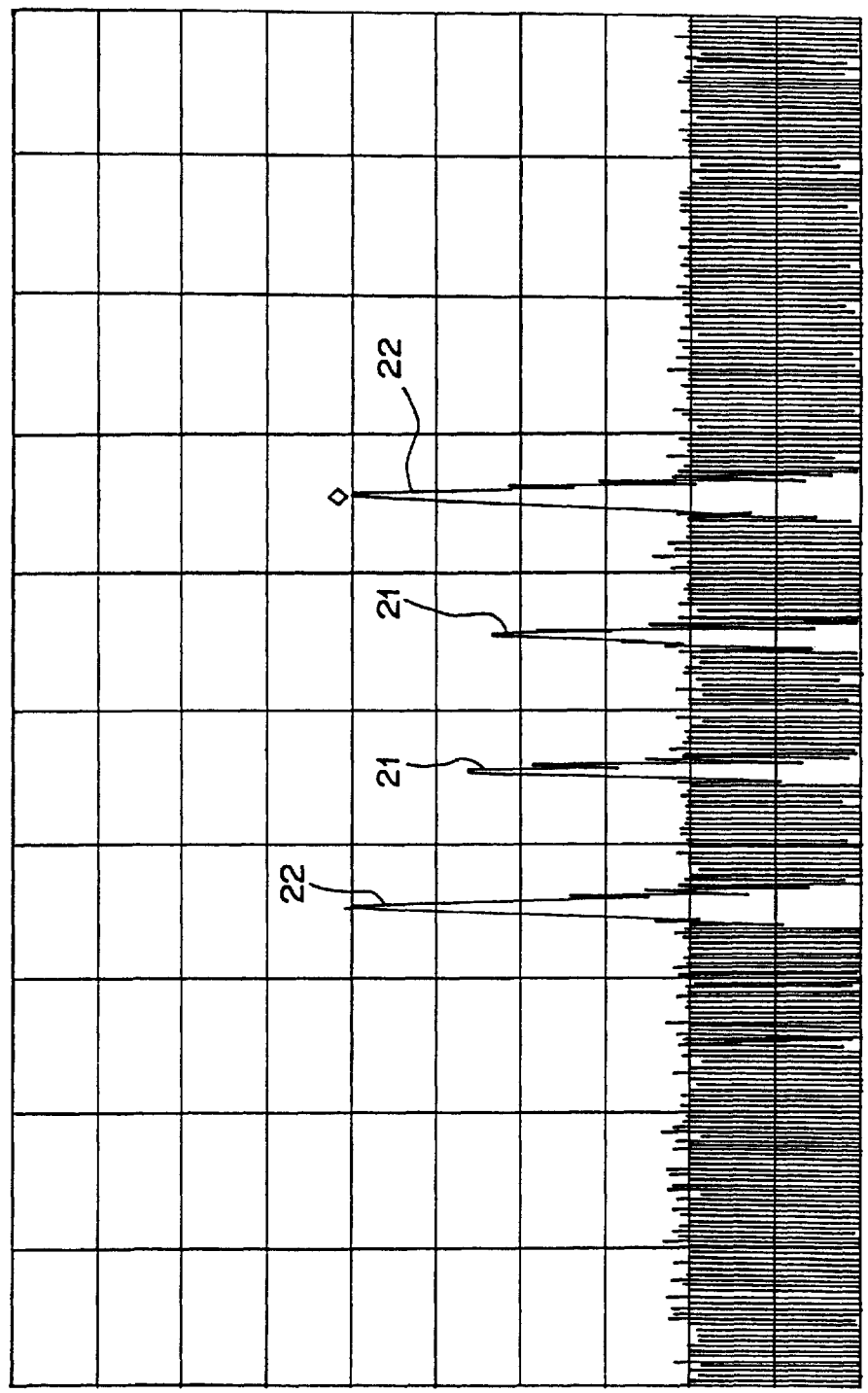
FIG. 4 is a graph illustrating an exemplary frequency spectrum of a distortion component in the amplifier apparatus of the first embodiment.

Assuming that a signal output from the phase/power level regulating circuit 13b is combined with the output of the combining circuit 7 by the amplifier-output combining circuit 13c, it is possible to cancel the primary signal component 21 once again by combining the signal from the phase/power level regulating circuit 13b with the output of the combining circuit 7 in the amplifier-output combining circuit 13c, even if the primary signal component 21 is remained in the output of the combining circuit 7 escaping from cancellation (see FIG. 4).

In this manner, according to the amplifier apparatus 30 of the second modification of the first embodiment, the same result as that of the amplifier apparatus 30 of FIG. 1 can be obtained. Further, the primary signal component 21 remained uncanceled in the output of the combining circuit 7 is re-canceled by combining the output of the combining circuit 7 and the part of the primary signal from the primary-amplifier-output phase/power level regulating circuit 5 in the amplifier-output combining circuit 13. It is therefore possible to detect a distortion component 22 with increased accuracy to obtain a high-accuracy distortion compensating signal so that more effective compensation for a distortion component 22 contained in the output of the primary amplifier 3 can be achieved.

Figure 8:
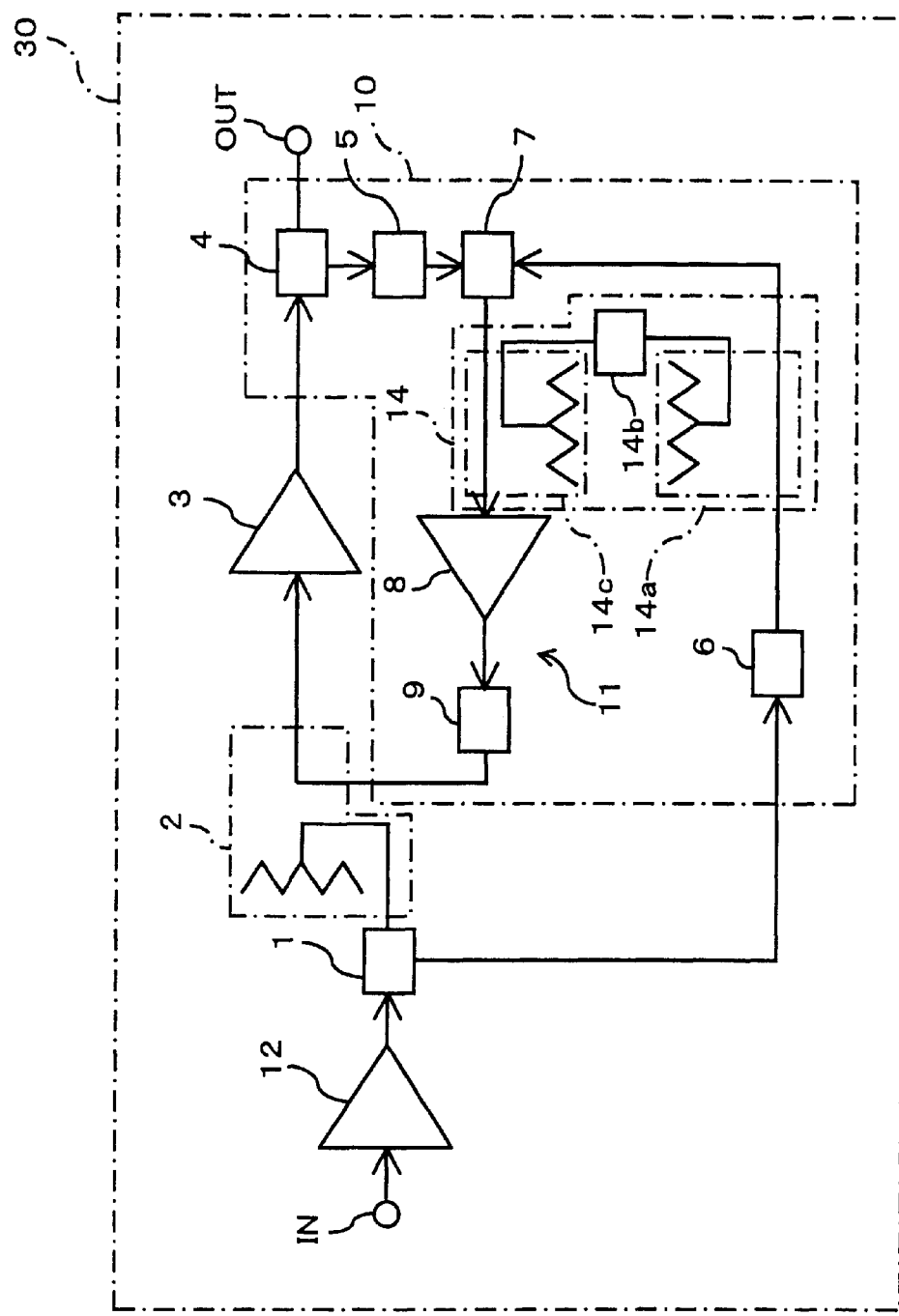
FIG. 8 is a circuit diagram showing an amplifier apparatus according to a third modification of the first embodiment.

(a3) Third Modification of First Embodiment:

FIG. 8 is a circuit diagram of an amplifier apparatus according to a third modification of the first embodiment. The amplifier apparatus 30 of FIG. 8 is different from the amplifier apparatus 30 of FIG. 1 in that it has an auxiliary signal combining circuit 14.

The auxiliary signal combining circuit 14, which picks up a part of an auxiliary signal output from the auxiliary-signal phase/power level regulating circuit 6 and combines this partial output with a distortion component from the combining circuit 7, comprises an auxiliary signal dividing circuit 14a, a auxiliary-signal phase/power level regulating circuit 14b, and an auxiliary signal combining circuit 14c.

The auxiliary signal dividing circuit 14a picks up a part of an auxiliary signal from the auxiliary-signal phase/power level regulating circuit 6, the auxiliary-signal phase/power level regulating circuit 14b regulates the signal from the auxiliary signal dividing circuit 14a in phase and power level, and the auxiliary signal combining circuit 14c combines the signal from the auxiliary-signal phase/power level regulating circuit 14b with the output from the combining circuit 7.

With this construction, in the amplifier apparatus 30 of the third modification of the first embodiment, the auxiliary signal dividing circuit 14a picks up a part of the signal (frequency spectrum 55; see FIG. 1) from the primary-amplifier-output phase/power level regulating circuit 5, and the auxiliary-signal phase/power level regulating circuit 14b regulates the picked up signal so as to be equal in power level in opposite phase to a primary signal component 21 (FIG. 4) remained uncanceled in an output of the combining circuit 7.

A signal output from the auxiliary-signal phase/power level regulating circuit 14b is then combined with the output of the combining circuit 7 by the combining circuit 14c to re-cancel the primary signal component 21 remained uncanceled in the output of the combining circuit 7.

In this manner, also in the amplifier apparatus 30 of the third modification of the first embodiment, the same result as that of the amplifier apparatus 30 of FIG. 1 can be obtained. Further, since the primary signal component 21 remained uncanceled in the output of the combining circuit 7 is combined with the part of the auxiliary signal by the auxiliary signal combining circuit 14, it is possible to re-cancel the primary signal component 21 remained uncanceled in the output of the combining circuit 7 so that a distortion component 22 can be detected with increased accuracy. As the result, a high-accuracy distortion compensating signal can be obtained to more effectively compensate for the distortion component 22 contained in the output of the primary amplifier 3.

Figure 9:
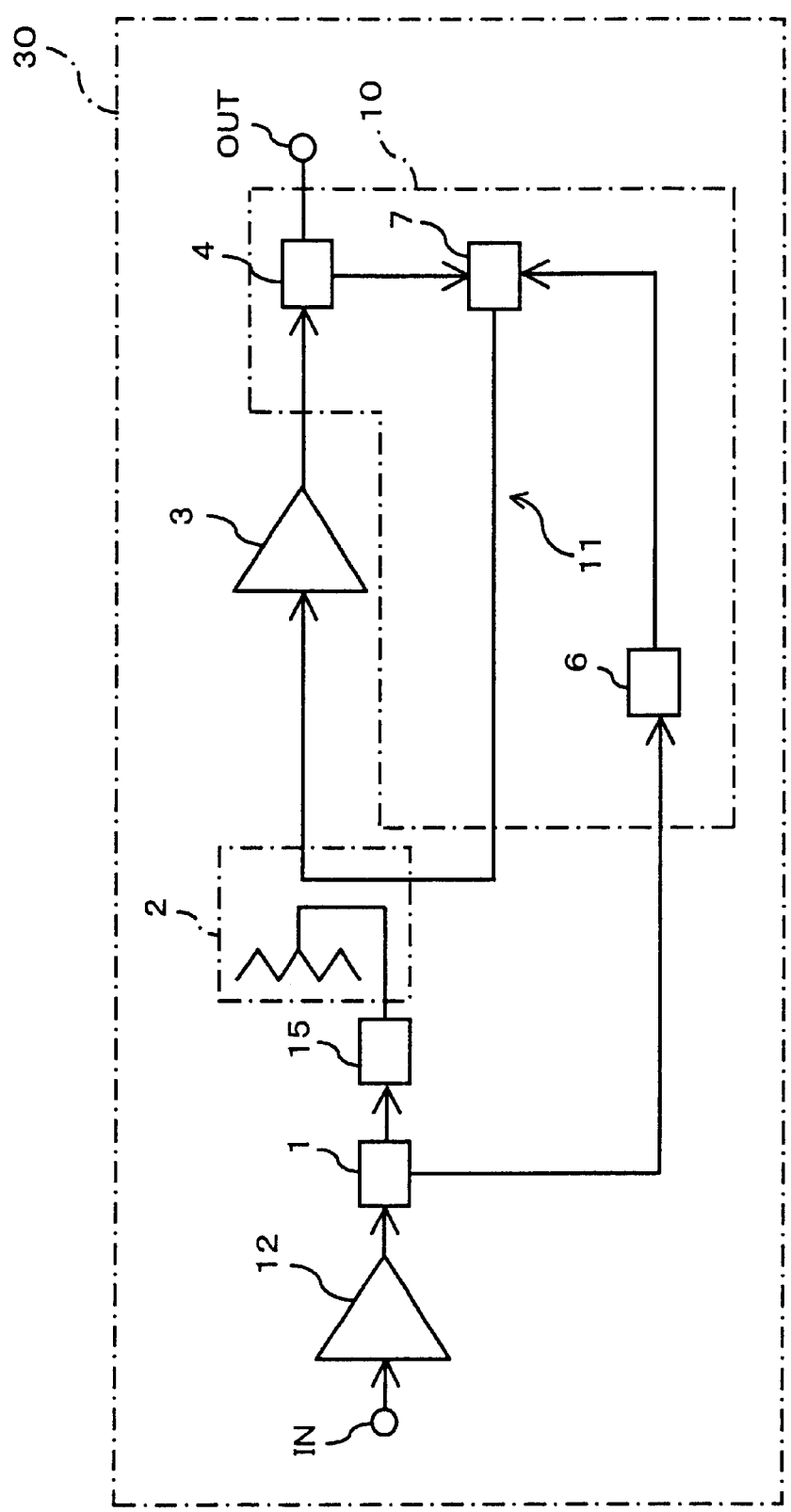
FIG. 9 is a circuit diagram showing an amplifier apparatus according to a fourth modification of the first embodiment.

(a4) Fourth Modification of First Embodiment:

FIG. 9 is a circuit diagram of an amplifier apparatus according to a fourth modification of the first embodiment. The amplifier apparatus 30 of FIG. 9 is different from the amplifier apparatus 30 of FIG. 1 in that it has an third phase/power level regulating circuit 15, excluding the auxiliary amplifier 8, the primary-amplifier-output phase/power level regulating circuit 5, and the first phase/power level regulating circuit 9.

The third phase/power level regulating circuit 15 regulates a primary signal from the primary signal combining circuit 2 in phase and power level.

Namely, in the amplifier apparatus 30 of FIG. 1, phase/power level regulations are performed by the primary-amplifier-output phase/power level regulating circuit 5, the first phase/power level regulating circuit 9, and the auxiliary-signal phase/power level regulating circuit 6. Whereas in the fourth modification, the regulations are performed by the third phase/power regulating circuit 15 and the auxiliary-signal phase/power level regulating circuit 6.

In the amplifier apparatus 30 of the fourth modification of the first embodiment, the part of the output of the primary amplifier 3, which partial output is picked up by the second dividing circuit 4, is input directly to the combining circuit 7 without being regulated in phase/power level. The auxiliary signal from the first dividing circuit 1 is regulated by the auxiliary-signal phase/power level regulating circuit 6 so as to be equal in power level in opposite phase to the signal from the second dividing circuit 4, and the resultant auxiliary signal is then input to the combining circuit 7.

After that, the combining circuit 7 combines the signal from the second dividing circuit 4 and the auxiliary signal from the auxiliary-signal phase/power level regulating circuit 6 to detect the distortion component, and the detected distortion component is directly combined with the primary signal by the primary signal combining circuit 2, without being regulated in phase/power level, and the composite signal is input to the primary amplifier 3.

In other words, instead of regulating the phase and power level of the distortion component obtained by the combining circuit 7, the primary signal is regulated in phase and power level by the third phase/power level regulating circuit 15 so as to be opposite in phase to the last-mentioned distortion component in such a way that the distortion component can be canceled in the output of the primary amplifier 3. The thus regulated primary signal is combined with the distortion component by the primary signal combining circuit 2.

According to the amplifier apparatus 30 of the fourth modification of the first embodiment, the same result of the amplifier apparatus 30 of FIG. 1 can be achieved. In addition, since the primary signal is combined directly with the distortion component detected by the combining circuit 7, the number of phase/power level regulating circuits is decreased in the feedback loop 11 so that the power consumption, the circuit size, the number of circuit elements, and the costs also can be reduced.

Figure 10:
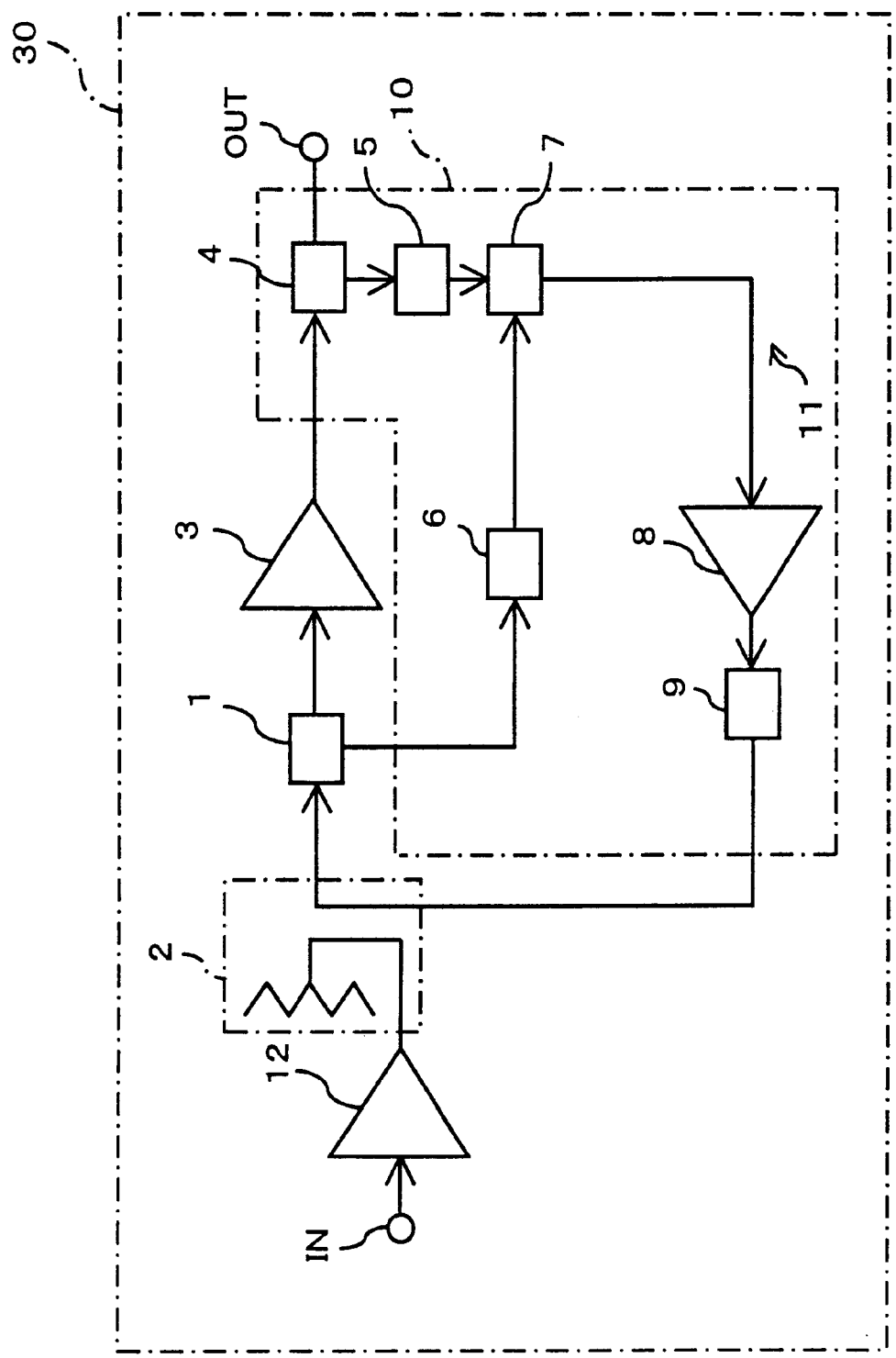
FIGS. 10 through 14 are circuit diagrams showing the amplifier apparatus of the second embodiment.

(B) Second Embodiment:

FIG. 10 is a circuit diagram of an amplifier apparatus according to a second embodiment. The amplifier apparatus 30 of FIG. 10 is different from the amplifier apparatus 30 of the first embodiment of FIG. 1 in that the first dividing circuit 1 is disposed between the primary signal combining circuit 2 and the primary amplifier 3. In this case, the feedback loop 11 is formed of the second dividing circuit 4, the primary-amplifier-output phase/power level regulating circuit 5, the auxiliary-signal phase/power level regulating circuit 6, the combining circuit 7, the auxiliary amplifier 8, and the first phase/power level regulating circuit 9. The distortion compensating signal is fed back to the input side of the first dividing circuit 1.

By this, the primary signal from the input terminal (IN) is input to the first dividing circuit 1 via the primary signal combining circuit 2 where the input signal is divided into the primary signal to be input to the primary amplifier 3 and the auxiliary signal to be input to the auxiliary-signal phase/power level regulating circuit 6.

After the primary signal is amplified by the primary amplifier 3, a part of the amplified primary signal is picked up by the second dividing circuit 4, and the picked up signal is then regulated in phase and power level by the primary-amplifier-output phase/power level regulating circuit 5.

In the meantime, the auxiliary signal picked up by the first dividing circuit 1 is regulated in phase and power level by the auxiliary-signal phase/power level regulating circuit 6 so as to be equal in power level in opposite phase to the signal from the primary-amplifier-output phase/power level regulating circuit 5.

By this, when the combining circuit 7 combines the signal from the primary-amplifier-output phase/power level regulating circuit 5 and the auxiliary signal from the auxiliary-signal phase/power level regulating circuit 6, the primary signal component 21 contained in the signal from the primary-amplifier-output phase/power level regulating circuit 5 is canceled by the auxiliary signal for the auxiliary-signal phase/power level regulating circuit 6, thus extracting only the distortion component.

After being amplified by the auxiliary amplifier 8, the thus extracted distortion component is input to the first phase/power level regulating circuit 9 where the input distortion component is regulated in phase so as to be opposite to the primary signal from the primary signal attenuation compensating amplifier 12 and also in power level so that the distortion component contained in the output of the primary amplifier 3 is canceled, whereupon the resultant distortion component is output as a distortion compensating signal.

After that, the primary signal is combined with the distortion compensating signal by the primary signal combining circuit 2. The thus obtained primary signal being combined with the distortion compensating signal is input to the primary amplifier 3 via the primary signal combining circuit 2 and is then divided by the first dividing circuit 1 into the primary signal and the auxiliary signal. This primary signal output from the first dividing circuit 1 is amplified by the primary amplifier 3.

As the result, since the distortion component contained in the output of the primary amplifier 3 is canceled, only the primary signal component is output from the output terminal (OUT) via the second dividing circuit 4 as an amplifier output.

In this manner, in addition to the same result as that of the amplifier apparatus 30 of the first embodiment, an advantageous result can be achieved that the auxiliary signal with a view to the influence of disturbance occurred at the input side of the present amplifier apparatus 30 is obtained, thereby attaining more effective compensation for the distortion component.

Further, in this case, although oscillation could appear due to the feedback loop 11, it is possible to extract such oscillation component by the first dividing circuit 1 and the second dividing circuit 4 for cancellation, because the first dividing circuit 1 is provided between the primary signal combining circuit 2 and the primary amplifier 3 (namely, the dividing circuit 1 is close to the amplifier 3 and the combining circuit 2 is close to the input side).

Furthermore, since the primary signal combining circuit 2 is disposed closer to the input side than the first dividing circuit 1 is, it is possible to regulate the gains of the primary signal and the auxiliary signal by varying the attenuation of the primary signal combining circuit 2, thus facilitating regulating the gain of the whole amplifier apparatus 30.

Figure 11:
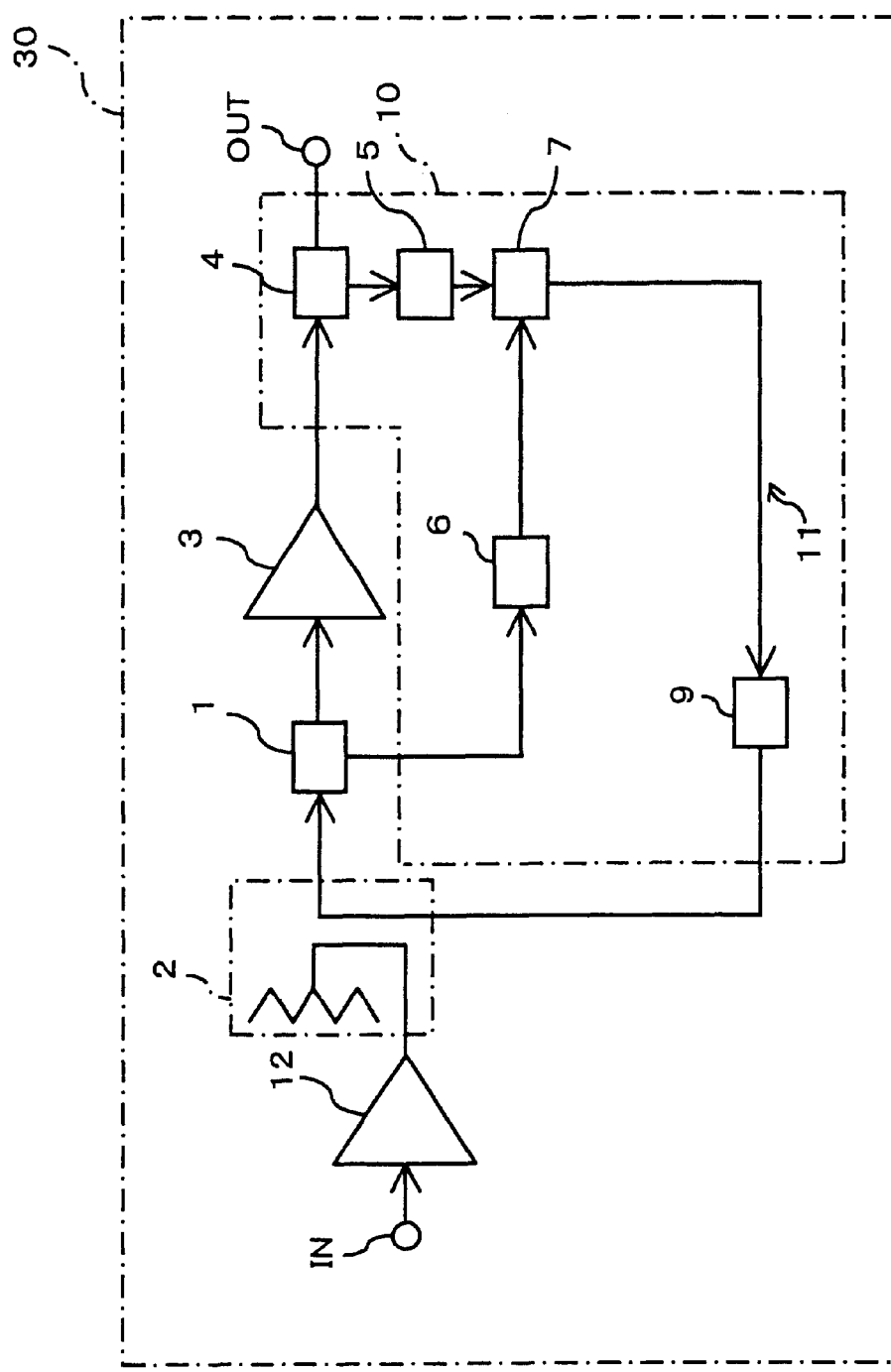

As long as the gain of the distortion compensating signal is adequate, the auxiliary amplifier 8 may be also excluded as shown in FIG. 11.

Namely, the distortion compensating signal generating circuit 10 of the amplifier apparatus 30 of FIG. 11 has no auxiliary amplifier. The distortion component obtained by the combining circuit 7 is input directly to the first phase/power level regulating circuit 9 without being amplified.

In this manner, since the necessity of the auxiliary amplifier 8 can be eliminated, it is possible to reduce the power consumption, the circuit size, the number of circuit elements, and the costs. Additionally, since active elements no longer exist in the feedback loop 11 between the output and input of the primary amplifier 3, it is possible to prevent the influence on compensation for the distortion component caused by oscillation within the feedback loop 11 so that effective distortion compensation can be achieved.

The above-mentioned differential amplifier 40 (see FIG. 6) may be disposed at the input side of the combining circuit 7 of FIG. 10.

A signal from the second dividing circuit 4 (FIG. 1) is input to Input 1; an auxiliary signal, to Input 2. The respective drain outputs of FET 1 and FET 2 are input to the combining circuit 7.

As the result, the output of the combining circuit 7 is obtained by combining the differential amplification outputs of the signal from the second dividing circuit 4 and the auxiliary signal. Therefore, only the distortion component is output as the primary signal component is canceled in the output.

In this manner, partly since the signal from the second dividing circuit 4 and the auxiliary signal are input to the differential amplifier 40, and partly since the outputs of the differential amplifier 40 are then combined by the combining circuit 7, it is unnecessary to provide the combining circuit 7, the amplifier for compensating the distortion in the part of the output of the primary amplifier 3, and the amplifier for compensating the distortion in the auxiliary signal, as separate circuits. Namely it is possible to integrate these circuits on a single microchip so that intended distortion compensation can be realized with a simple construction.

Figure 12:
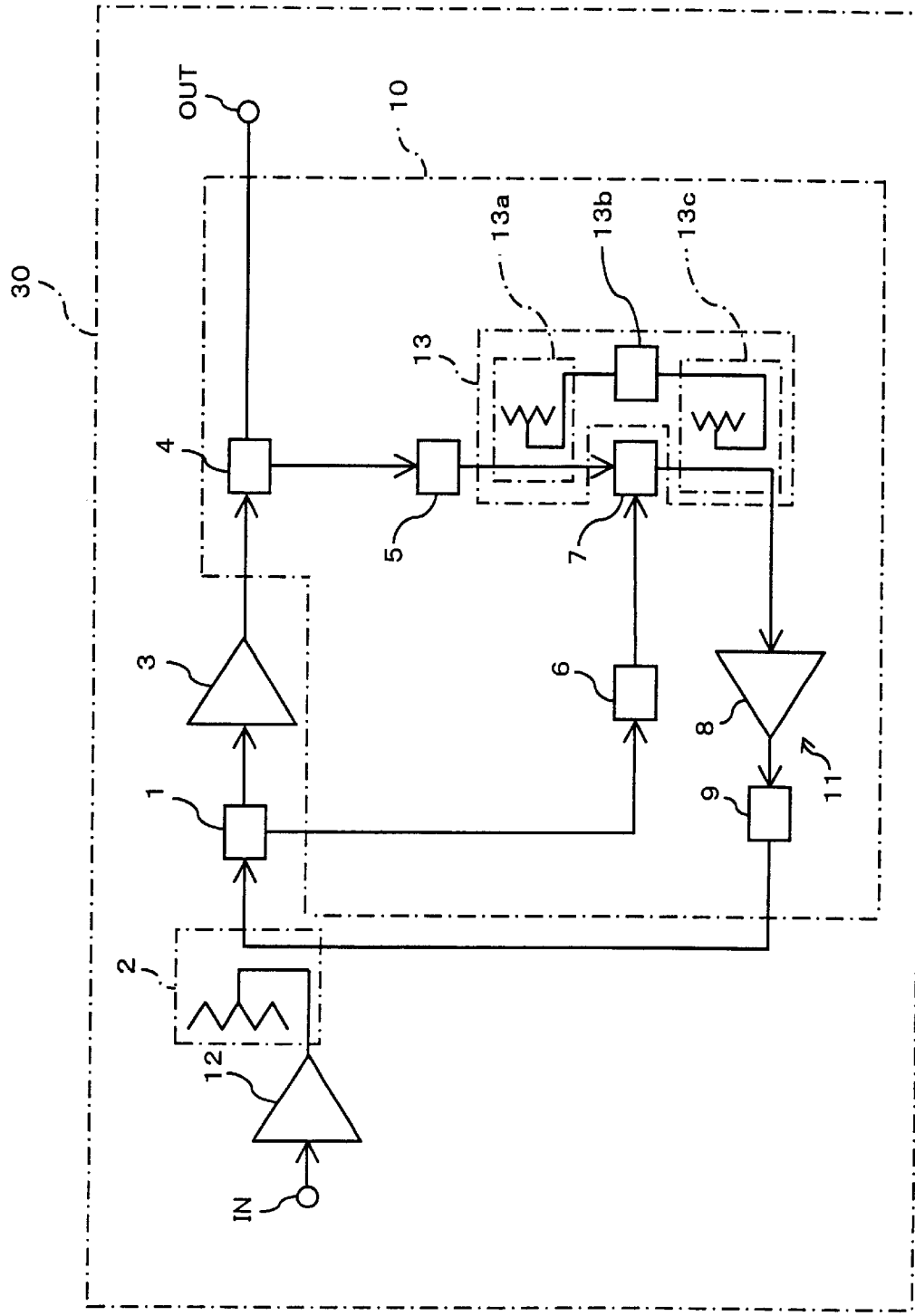

Further, such as shown in FIG. 12, the above-mentioned amplifier-output combining circuit 13 may be provided in the amplifier apparatus 30 of the second embodiment of FIG. 10.

With this construction, the amplifier-output dividing circuit 13a picks up a part of the signal from the primary-amplifier-output phase/power level regulating circuit 5. The amplifier-output phase/power level regulating circuit 13b regulates the picked-up signal so as to be equal in power level in opposite phase to the primary signal component 21 remained uncanceled in the output of the combining circuit 7.

Then, the amplifier-output combining circuit 13c combines the signal from the amplifier-output phase/power level regulating circuit 13b with the output of the combining circuit 7 to re-cancel the primary signal component remained uncanceled in the output of the combining circuit 7, and the output of the combining circuit 7, which contains only the distortion component, is then input to the auxiliary amplifier 8.

Also in this case, in addition to the same result as that of the amplifier apparatus 30 of FIG. 10, the following advantageous results can be achieved. Since the primary signal component remained uncanceled in the output of the combining circuit 7 is re-canceled by combining the output of the combining circuit 7 and the part of the signal from the primary-amplifier-output phase/power level regulating circuit 5 in the amplifier-output combining circuit 13, it is possible to detect the distortion component with increased accuracy so that a high-accuracy distortion compensating signal can be obtained, thus enabling more effective compensation for the distortion component contained in the output of the primary amplifier 3.

Figure 13:
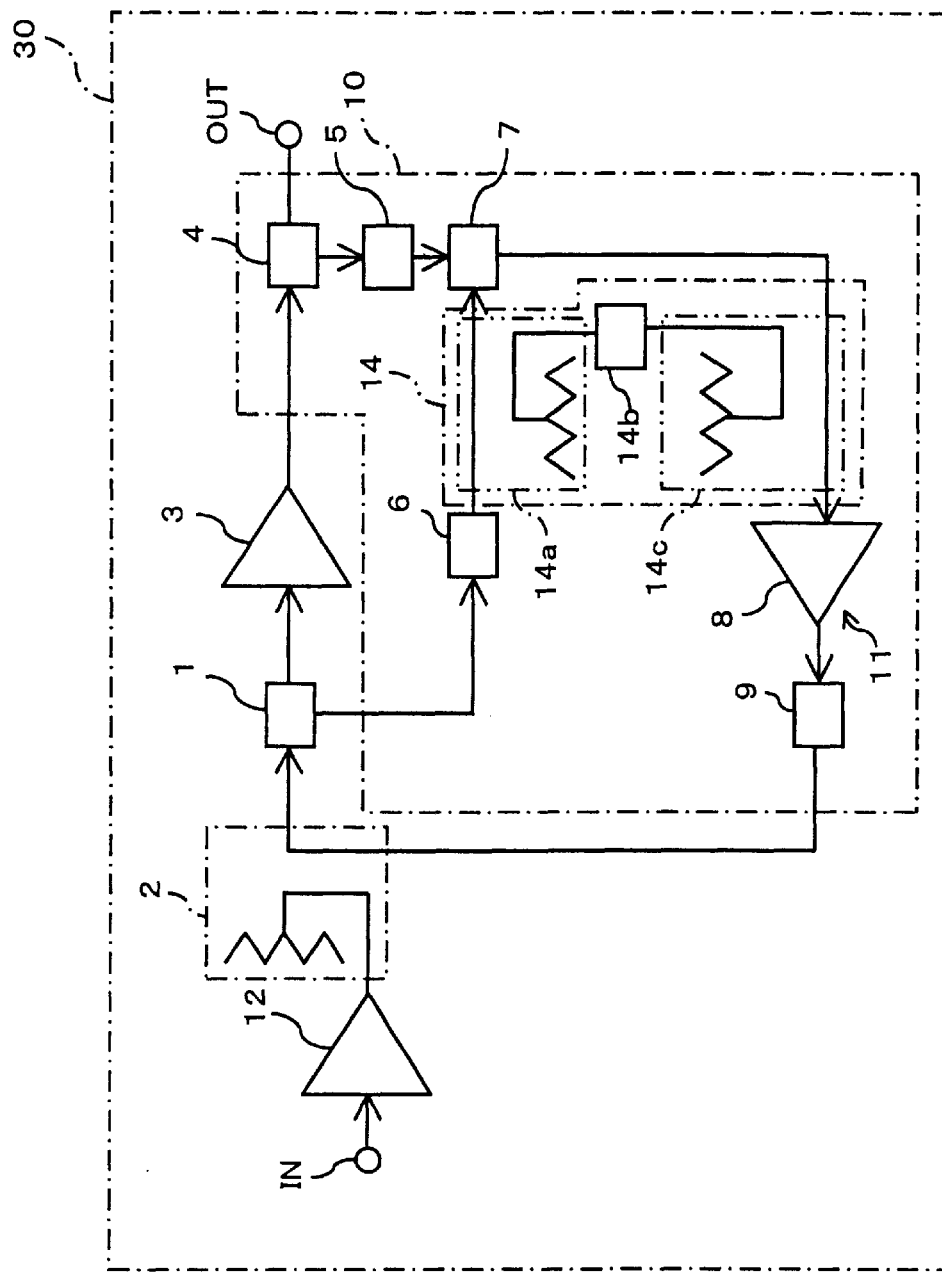

Further, such as shown in FIG. 13, the above-mentioned auxiliary signal combining circuit 14 of FIG. 8 may be provided in the amplifier apparatus 30 of FIG. 10.

With this construction, the auxiliary signal dividing circuit 14a picks up a part of the signal (frequency spectrum 55; in FIG. 1) from the primary-amplifier-output phase/power level regulating circuit 5, and the auxiliary-signal phase/power level regulating circuit 14b regulates the picked up signal so as to be equal in power level in opposite phase to a primary signal component 21 (see FIG. 4) remained uncanceled in an output of the combining circuit 7.

A signal output from the auxiliary-signal phase/power level regulating circuit 14b is then combined with the output of the combining circuit 7 by the combining circuit 14c to re-cancel the primary signal component 21 remained in the output of the combining circuit 7.

In this manner, since the primary signal component remained uncanceled in the output of the combining circuit 7 is combined with the part of the auxiliary signal by the auxiliary signal combining circuit 14, it is possible to re-cancel the primary signal component remained in the output of the combining circuit 7 so that a distortion component can be detected with increased accuracy. As the result, a distortion compensating signal of high accuracy can be obtained to more effectively compensate for the distortion component contained in the output of the primary amplifier.

Figure 14:
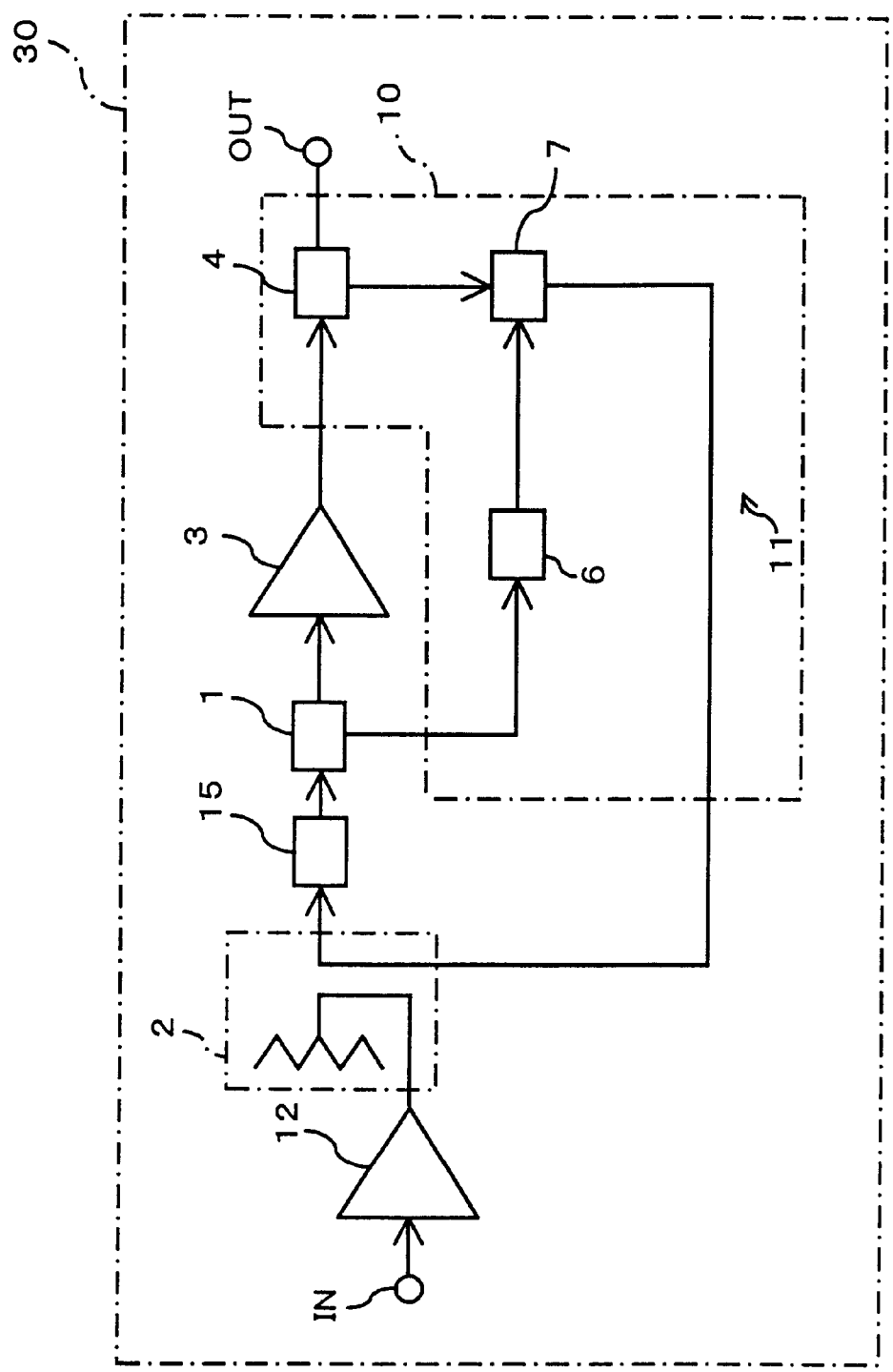

Further, as shown in FIG. 14, the amplifier apparatus 30 of FIG. 10 may have the aforementioned third phase/power level regulating circuit 15 of FIG. 9, excluding the primary-amplifier-output phase/power level regulating circuit 5 and first phase/power level regulating circuit 9.

Also in this case, the part of the output of the primary amplifier 3 picked up by the second dividing circuit 4 is input directly to the combining circuit 7 without being regulated in phase/power level. The auxiliary signal from the first dividing circuit 1 is regulated by the auxiliary-signal phase/power level regulating circuit 6 so as to be equal in power level in opposite phase to the signal from the second dividing circuit 4, and the resulting auxiliary signal is then input to the combining circuit 7.

After that, the combining circuit 7 combines the signal from the second dividing circuit 4 and the auxiliary signal from the auxiliary-signal phase/power level regulating circuit 6 to detect the distortion component, and the detected distortion component is directly combined with the primary signal by the primary signal combining circuit 2 without being regulated in phase/power level, to input to the primary amplifier 3.

In other words, instead of regulating the phase and power level of the distortion component obtained by the combining circuit 7, the primary signal is regulated in phase and power level by the third phase/power level regulating circuit 15 so as to be opposite in phase to the distortion component in such a way that the distortion component can be removed in the output of the primary amplifier 3. The thus regulated primary signal is combined with the distortion component by the primary signal combining circuit 2.

In this manner, in addition to the same result as that of the amplifier apparatus 30 of FIG. 10, the following advantageous results can be achieved. Since the phase/power level regulations are performed by the third phase/power level regulating circuit 15 and the auxiliary-signal phase/power level regulating circuit 6, a phase/power level regulating circuit is no longer needed within the feedback loop 11 so that the power consumption, the circuit size, the number of circuit elements and the costs can be further reduced.

(C) Various Other Modifications:

The following is an exemplary method of controlling signals at various elements for effective compensation for the output of the amplifier apparatus 30 in the above-mentioned embodiments and modifications.

Figure 15A:
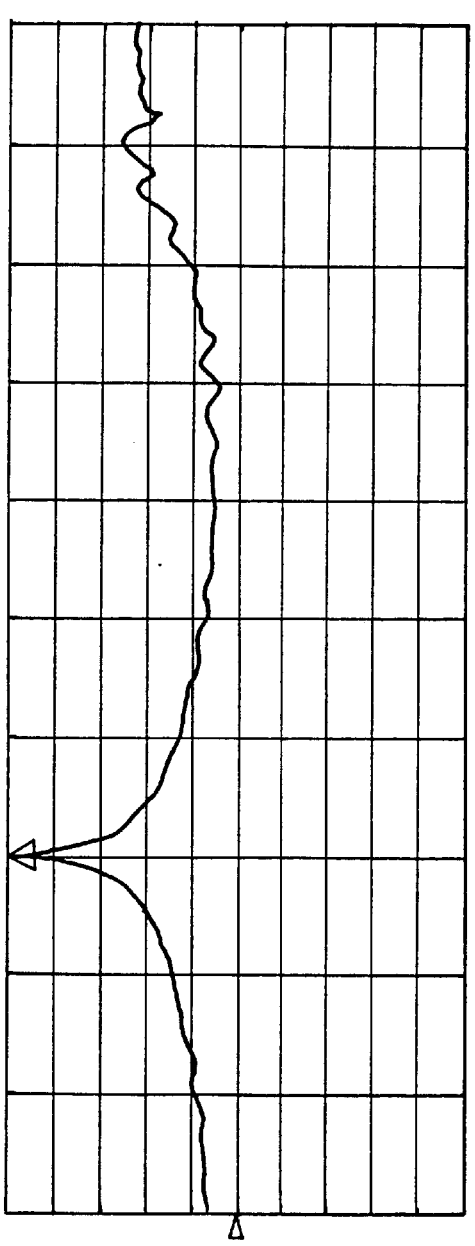
FIG. 15(a) is a graph illustrating an exemplary CW signal input for the purpose of describing phase and power level regulations in the amplifier apparatus embodying the present invention.
Figure 15B:
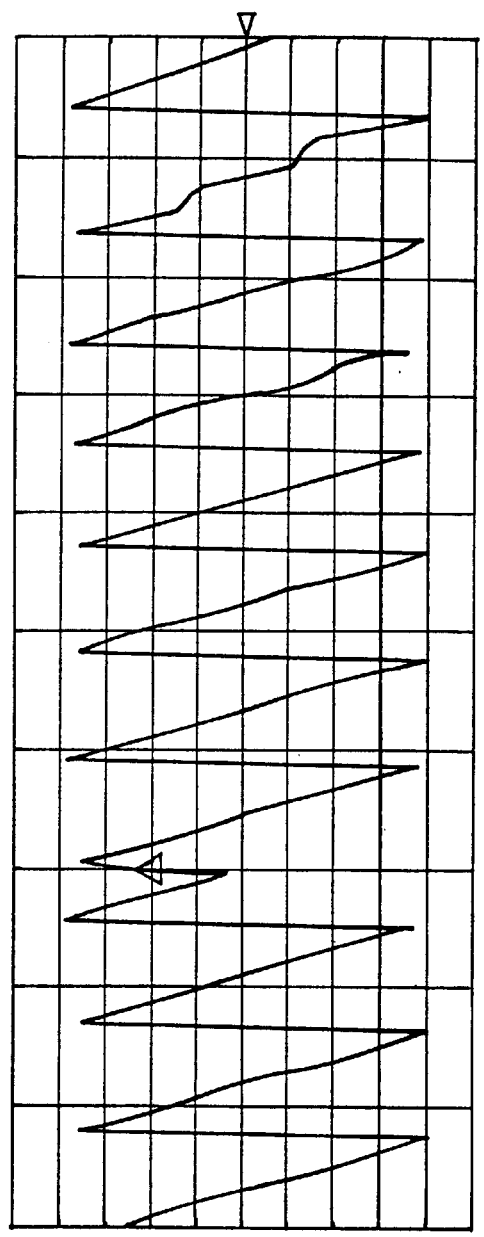
FIG. 15(b) is a graph illustrating an exemplary output signal after regulated in phase and power level in the amplifier apparatus embodying the present invention.

Namely, assuming that a continuous wave (CW) shown in FIG. 15A is input as an output of the primary signal combining circuit 2 of FIG. 1 and the phase and power level of the individual phase/power level regulating circuits is regulated while monitoring the output of the primary signal combining circuit 2 as shown in FIG. 15B, the output value of "0" (or most approximately "0") appears.

In such a control state that the output of the output terminal approximates "0", the distortion component can be most effectively compensated. If various control values of the amplifier apparatus 30 is set based on this state, effective distortion compensation can be achieved, canceling the primary signal in opposite phases as the power level is regulated.

Further, various changes and combinations may be suggested in the above-mentioned embodiments and modifications. For example, the amplifier apparatus 30 of FIGS. 5 through 14 may include the filter 16 of FIG. 1 (FIGS. 16, 17); the amplifier apparatus 30 of FIG. 7, the auxiliary signal combining circuit 14 of FIG. 18; the amplifier apparatus 30 of FIG. 9, the amplifier-output combining circuit 13 and/or the auxiliary signal combining circuit 14 of FIG. 7.

The present invention should by no means be limited to the above-illustrated embodiments and modifications, and various changes or modifications may be suggested without departing from the gist of the invention.

What is claimed is:

1. An amplifier apparatus comprising:
   an amplifier;
   a first dividing circuit, connected to an input side of said amplifier, for dividing an input signal into a primary signal, which is amplified by said amplifier, and an auxiliary signal, which is used for distortion detection;
   a distortion compensating signal generating circuit for generating a distortion compensation signal, which compensates a distortion component contained in an output of said amplifier, and inputting the distortion compensation signal to said amplifier directly; and
   a coupler for attenuating a power of the primary signal obtained by said first dividing circuit and coupling the attenuated primary signal with the distortion compensation signal, which is generated by said distortion compensation signal generating circuit.

2. An amplifier apparatus according to claim 1, wherein said first dividing circuit is connected to an input side of said coupler.

3. An amplifier apparatus according to claim 2, wherein said distortion compensating signal generating circuit includes:
   a second dividing circuit for picking up a part of the output of said amplifier; and
   a combining circuit for combining said part of the output of said amplifier, which part is picked up by said second dividing circuit, and said auxiliary signal obtained by said first dividing circuit in opposite phases to detect said distortion component; and a first phase/power level regulating circuit for regulating an output of said combining circuit in phase and power level to output said distortion compensating signal.

4. An amplifier apparatus according to claim 3, wherein:
   said distortion compensating signal generating circuit further includes a differential amplifier to which said part of the output of said amplifier, which part is picked up by said second dividing circuit, and said auxiliary signal obtained by said first dividing circuit are input; and
   said combining circuit is constructed so as to combine outputs of said differential amplifier.

5. An amplifier apparatus according to claim 3, wherein said distortion compensating signal generating circuit includes a first coupling circuit for coupling a part of said auxiliary signal with the output of said combining circuit.

6. An amplifier apparatus according to claim 3, wherein said distortion compensating signal generating circuit includes a second coupling circuit for coupling said part of the output of said amplifier, which part is picked up by said second dividing circuit, with the output of said combining circuit.

7. An amplifier apparatus according to claim 2, further comprising a primary signal attenuation compensating amplifier, connected to an input side of said first dividing circuit, for compensating attenuation of said primary signal in said coupler.

8. An amplifier apparatus according to claim 2, wherein said distortion compensating signal generating circuit includes an auxiliary amplifier for amplifying said distortion compensating signal.

9. An amplifier apparatus according to claim 2, wherein said distortion compensating signal generating circuit includes a plurality of series-connected band prevention filters whose band prevention center frequencies are shifted each off the band of said primary signal toward a low band side or a high band side to constitute a first composite filter which allows signal transmission in the band of said primary signal.

10. An amplifier apparatus according to claim 2, wherein said distortion compensating signal generating circuit includes a low-pass filter and a high-pass filter which are connected in series to constitute a second composite filter which allows signal transmission in the band of said primary signal.

11. An amplifier apparatus according to claim 1, wherein said distortion compensating signal generating circuit includes:
    a second dividing circuit for picking up a part of the output of said amplifier; and
    a combining circuit for combining said part of the output of said amplifier, which part is picked up by said second dividing circuit, and said auxiliary signal obtained by said first dividing circuit in opposite phases to detect said distortion component; and a first phase/power level regulating circuit for regulating an output of said combining circuit in phase and power level to output said distortion compensating signal.

12. An amplifier apparatus according to claim 11, wherein:
    said distortion compensating signal generating circuit further includes a differential amplifier to which said part of the output of said amplifier, which part is picked up by said second dividing circuit, and said auxiliary signal obtained by said first dividing circuit are input; and
    said combining circuit is constructed so as to combine outputs of said differential amplifier.

13. An amplifier apparatus according to claim 11, wherein said distortion compensating signal generating circuit includes a first coupling circuit for coupling a part of said auxiliary signal with the output of said second combining circuit.

14. An amplifier apparatus according to claim 11, wherein said distortion compensating signal generating circuit includes a second coupling circuit for coupling said part of the output of said amplifier, which part is picked up by said second dividing circuit, with the output of said combining circuit.

15. An amplifier apparatus according to claim 1, further comprising a primary signal attenuation compensating amplifier, connected to an input side of said first dividing circuit, for compensating attenuation of said primary signal in said coupler.

16. An amplifier apparatus according to claim 1, wherein said distortion compensating signal generating circuit includes an auxiliary amplifier for amplifying said distortion compensating signal.

17. An amplifier apparatus according to claim 1, wherein said distortion compensating signal generating circuit includes a plurality of series-connected band prevention filters whose band prevention center frequencies are shifted each off the band of said primary signal toward a low band side or a high band side to constitute a first composite filter which allows signal transmission in the band of said primary signal.

18. An amplifier apparatus according to claim 1, wherein said distortion compensating signal generating circuit includes a low-pass filter and a high-pass filter which are connected in series to constitute a second composite filter which allows signal transmission in the band of said primary signal.

19. An amplifier apparatus, comprising:
an amplifier;
a distortion compensating signal generating circuit for generating a distortion compensation signal, which compensates a distortion component contained in an output of said amplifier;
a coupler for attenuating a power of an input signal and coupling the attenuated input signal with the distortion compensation signal, which is generated by said distortion compensation signal generating circuit and providing an output signal; and
a first dividing circuit, connected to an input side of said amplifier, for dividing said output signal of said coupler into a primary signal, which is amplified by said amplifier, and an auxiliary signal, which is used for distortion detection;
wherein said first dividing circuit is disposed between said coupler and said amplifier.

20. An amplifier apparatus according to claim 19, wherein said distortion signal generating circuit includes:
a second dividing circuit for picking up a part of the output of said amplifier; and
a combining circuit for combining said part of the output of said amplifier, which part is picked up by said second dividing circuit, and said auxiliary signal obtained by said first dividing circuit in opposite phases to detect said distortion component; and a first phase/power level regulating circuit for regulating an output of said combining circuit in phase and power level to output said distortion compensating signal.

21. An amplifier apparatus according to claim 20, wherein:
said distortion compensating signal generating circuit further includes a differential amplifier to which said part of the output of said amplifier, which part is picked up by said second dividing circuit, and said auxiliary signal obtained by said first dividing circuit are input; and
said combining circuit is constructed so as to combine outputs of said differential amplifier.

22. An amplifier apparatus according to claim 20, wherein said distortion compensating signal generating circuit includes a first coupling circuit for coupling a part of said auxiliary signal with the output of said combining circuit.

23. An amplifier apparatus according to claim 20, wherein said distortion compensating signal generating circuit includes a second coupling circuit for coupling said part of the output of said amplifier, which part is picked up by said second dividing circuit, with the output of said combining circuit.

24. An amplifier apparatus according to claim 19, further comprising a primary signal attenuation compensating amplifier, connected to an input side of said first dividing circuit, for compensating attenuation of said primary signal in said coupler.

25. An amplifier apparatus according to claim 19, wherein said distortion compensating signal generating circuit includes an auxiliary amplifier for amplifying said distortion compensating signal.

26. An amplifier apparatus according to claim 19, wherein said distortion compensating signal generating circuit includes a plurality of series-connected band prevention filters whose band prevention center frequencies are shifted each off the band of said primary signal toward a low band side or a high band side to constitute a first composite filter which allows signal transmission in the band of said primary signal.

27. An amplifier apparatus according to claim 19, wherein said distortion compensating signal generating circuit includes a low-pass filter and a high-pass filter which are connected in series to constitute a second composite filter which allows signal transmission in the band of said primary signal.

* * * * *